(12) United States Patent
Wu et al.

(10) Patent No.: US 12,315,762 B2
(45) Date of Patent: May 27, 2025

(54) SELF-ALIGNED LINES AND METHODS FOR FABRICATING THE SAME

(71) Applicant: Taiwan Semiconductor Manufacturing Company Limited, Hsinchu (TW)

(72) Inventors: Yong-Jie Wu, Hsinchu (TW); Yen-Chung Ho, Hsinchu (TW); Hui-Hsien Wei, Taoyuan (TW); Chia-Jung Yu, Hsinchu (TW); Pin-Cheng Hsu, Zhubei (TW); Feng-Cheng Yang, Zhudong Township (TW); Chung-Te Lin, Taiwan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 726 days.

(21) Appl. No.: 17/523,111

(22) Filed: Nov. 10, 2021

(65) Prior Publication Data

US 2022/0344202 A1   Oct. 27, 2022

Related U.S. Application Data

(60) Provisional application No. 63/178,048, filed on Apr. 22, 2021.

(51) Int. Cl.
*H01L 21/768* (2006.01)
*H01L 23/528* (2006.01)
(Continued)

(52) U.S. Cl.
CPC .. *H01L 21/76834* (2013.01); *H01L 21/76802* (2013.01); *H01L 21/76885* (2013.01);
(Continued)

(58) Field of Classification Search
CPC ........... H01L 21/76841; H01L 21/7685; H01L 21/768; H01L 21/76885; H01L 21/76838;
(Continued)

(56) References Cited

U.S. PATENT DOCUMENTS

2018/0076133 A1* 3/2018 Bonilla ............. H01L 21/76877
2022/0045003 A1* 2/2022 Bae .................. H01L 21/76897

* cited by examiner

*Primary Examiner* — Jose R Diaz
(74) *Attorney, Agent, or Firm* — The Marbury Law Group, PLLC

(57) ABSTRACT

A disclosed method of fabricating a semiconductor structure includes forming a first conductive pattern over a substrate, with the first conductive pattern including a first conductive line and a second conductive line. A barrier layer may be conformally formed over the first conductive line and the second conductive line of the first conductive pattern. An insulating layer may be formed over the barrier layer. The insulating layer may be patterned to form openings between conductive lines of the first conductive pattern a second conductive pattern may be formed in the openings. The second conductive pattern may include a third conductive line is physically separated from the first conductive pattern by the barrier layer. The presence of the barrier layer reduces the risk of a short circuit forming between the first and second conductive patterns. In this sense, the second conductive pattern may be self-aligned relative to the first conductive pattern.

20 Claims, 19 Drawing Sheets

(51) Int. Cl.
*H10D 64/01* (2025.01)
*H10D 99/00* (2025.01)

(52) U.S. Cl.
CPC ......... *H01L 23/5283* (2013.01); *H10D 64/01* (2025.01); *H10D 99/00* (2025.01); *H01L 21/76843* (2013.01); *H01L 21/76877* (2013.01)

(58) Field of Classification Search
CPC ............. H01L 21/76816; H01L 23/528; H01L 23/5226; H01L 21/76834; H01L 23/5283
See application file for complete search history.

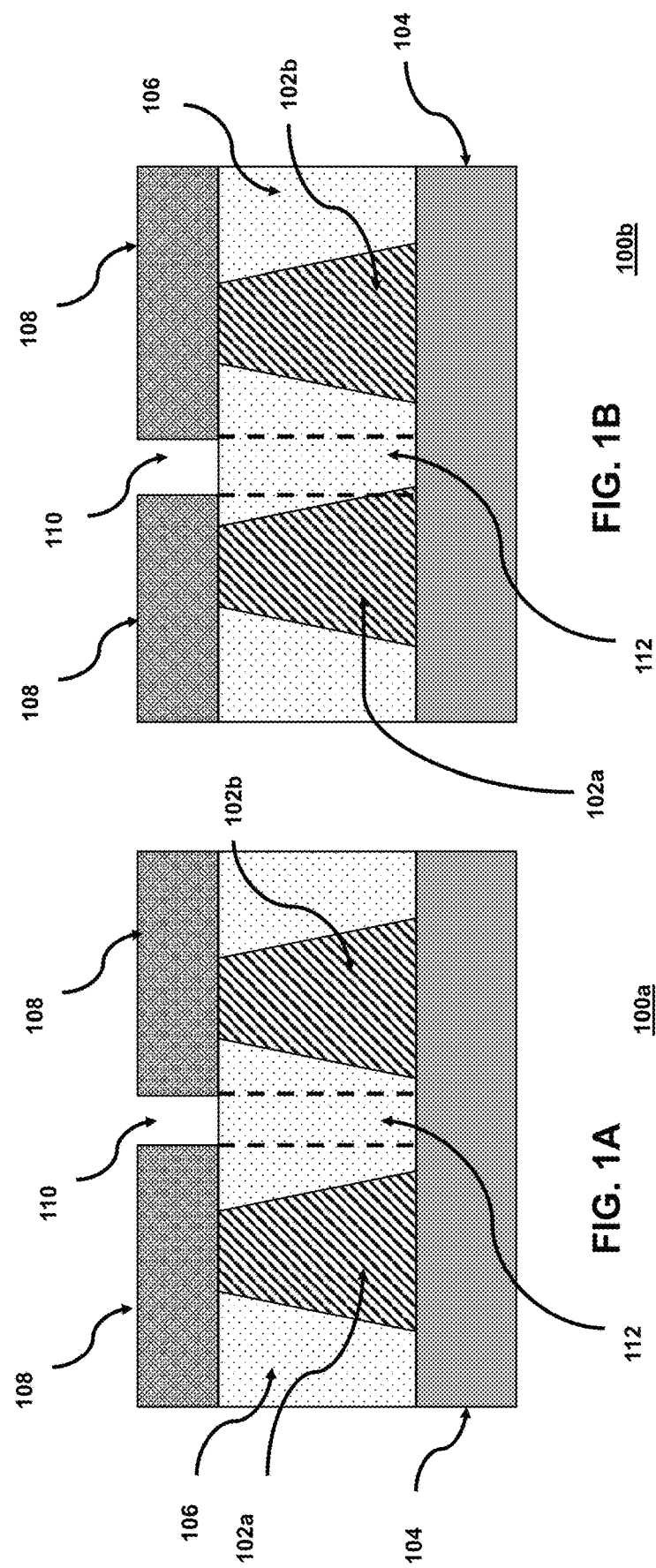

SELF-ALIGNED LINES AND METHODS FOR FABRICATING THE SAME

RELATED APPLICATIONS

This application claims priority to U.S. Provisional Patent Application No. 63/178,048 entitled "SAL use in advance tech process" filed on Apr. 22, 2021, the entire contents of which are hereby incorporated by reference for all purposes.

BACKGROUND

In the semiconductor and integrated circuit (IC) industry there is constant economic pressure to reduce the size of ICs to thereby increase areal and volume density of digital circuits. To do so, individual transistors, interconnects, and related structures have become increasingly smaller and there is an ongoing need to develop new materials, processes, and designs of semiconductor devices and interconnects to allow further progress. Interconnects may be generated using a double patterning/double etch process to increase feature density. These methods, however, may suffer from problems related to alignment of structures made in a first pattering/etch process relative to structures made in a second patterning/etch process.

BRIEF DESCRIPTION OF THE DRAWINGS

Aspects of this disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A and FIG. 1B are vertical cross-sectional views of a system having two adjacent conductive lines formed on a substrate by a first patterning/etch process, followed by deposition of a barrier layer, and a patterned photoresist prior to formation of a third conductive line with a second patterning/etch process, according to various embodiments.

DETAILED DESCRIPTION

Figures 2A, 2B:
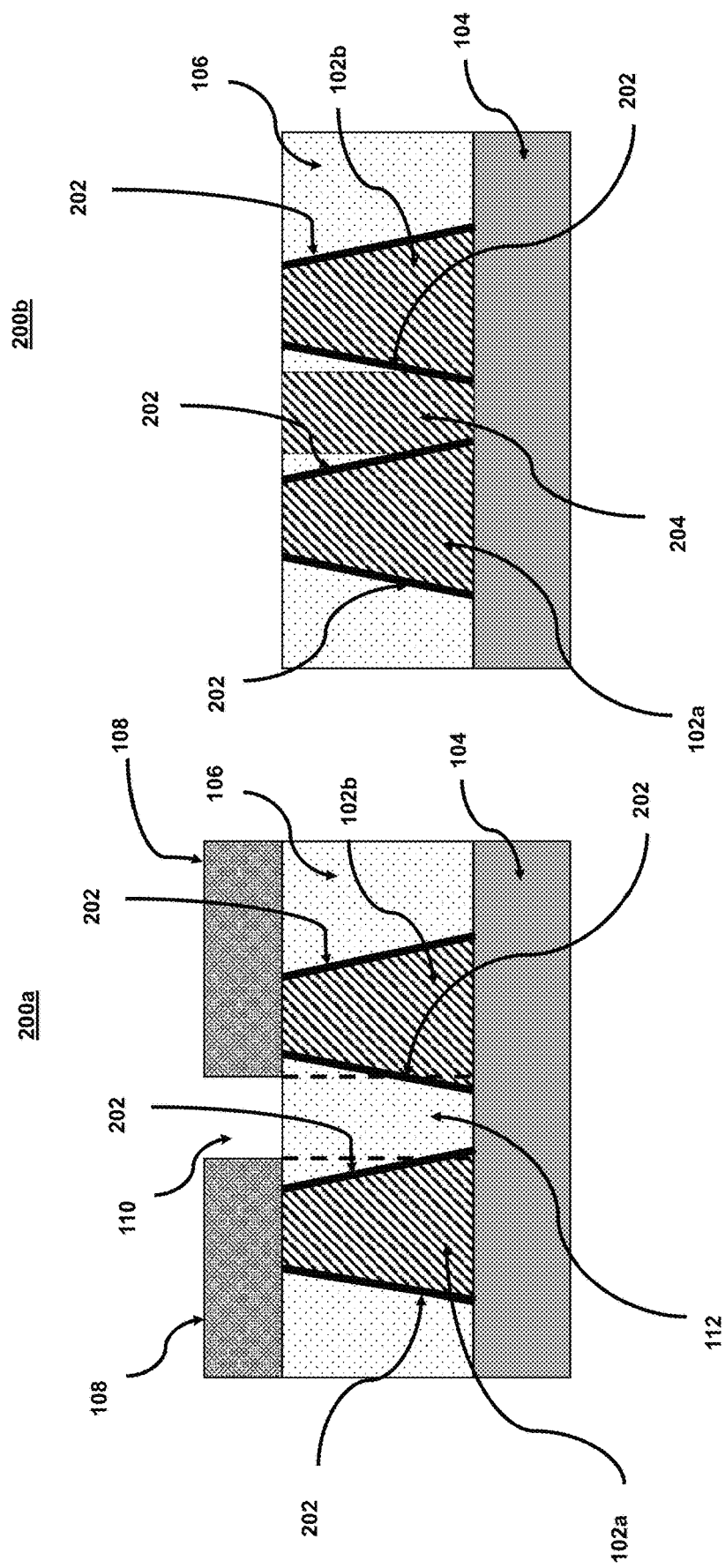
FIG. 2A and FIG. 2B are vertical cross-sectional views of a structure having a first conductive line and a second conductive line formed on a substrate by a first patterning/etch process, and a third conductive line formed with a second patterning/etch process using the system of FIG. 1A and FIG. 1B, according to various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

This disclosure is directed to sets of interconnects formed with a double patterning/double etch process that may be used to generate structures with increased feature density. In this regard, an optical projection system may be used to pattern a photoresist layer to produce a first set of interconnects (e.g., lines) having a first pitch. A first set of conductive lines having the first pitch may then be formed on a substrate in a first etching process. A second patterning/etch process may then be performed to generate a second set of lines, also having the same first pitch, but offset from the first set of conductive lines such that the second set of conductive lines is located in spaces between adjacent lines in the first plurality of lines. Ideally, the resulting structure (i.e., a structure including the combined set of the first and second pluralities of conductive lines) may have conductive lines characterized by a second pitch which is half of the first pitch.

The above-described methods, however, may suffer from problems relating to alignment of the first plurality of lines and the second plurality of lines. As feature density increases, the spacing between features decreases. As a result, the tolerances for alignment issues also decreases. The disclosed embodiments include methods for performing double patterning/double etch processes that overcome potential problems associated with alignment of the first set of conductive lines relative to the second set of lines. In this sense, the disclosed embodiments allow the second set of conductive lines to be self-aligned relative to the first set of conductive lines.

FIG. 1 is a vertical cross-sectional view of a structure 100 having two adjacent conductive lines 102a and 102b formed on a substrate 104 by a first patterning/etch process, according to various embodiments. Conductive lines 102a and 102b may be formed by patterning and etching a metal layer formed on a substrate 104. An insulating layer, for example an oxide layer 106, may then be formed over the conductive lines 102a and 102b followed by formation of a patterned photoresist 108.

The photoresist 108 may be patterned to have an opening 110 that may be aligned with spaces 112 between adjacent conductive lines, for example between first the conductive line 102a and the second conductive line 102b, in which a proposed conductive line may be formed. An anisotropic etch may be performed to form cavities (not shown) between the first conductive line 102a and the second conductive line 102b. A conductive material may then be deposited in the cavities to form a second set of conductive lines (not shown) between the first conductive line 102a and the second conductive line 102b. This technique, however, may be subject to problems associated with alignment of the opening 110 relative to adjacent conductive lines 102a and 102b when the spacing 112 (i.e., where the proposed conductive line is to be formed) between conductive lines 102a and 102b is very small.

, as described in greater detail with reference to FIGS. 3 and 4, below. Structure 100 may further include a barrier layer 202 (e.g., an etch stop layer) formed on external surfaces of conductive lines 102a and 102b. The barrier layer 202 may include a metal oxide. The barrier layer 202 may act as an insulating barrier to prevent conductive short circuits between conductive lines that may otherwise occur in instances in which a formation of a proposed third conductive line were to be formed so as to come in contact with one or both of conductive lines 102a and 102b. To form the proposed third conductive line (e.g., line 204 in FIG. 2), the intermediate structure 100 may further include an insulating layer, for example an oxide layer 106, and a patterned photoresist 108 having openings 110.

FIG. 2A and FIG. 2B are vertical cross-sectional views of a structure 200 having the first conductive line 102a and the second conductive line 102b formed on the substrate 104 by a first patterning/etch process, and a third conductive line 204 formed using a second patterning/etch process using the system of FIG. 1A and FIG. 1B, according to various embodiments. As shown in FIG. 1A and FIG. 1B, the opening 110 of the patterned photoresist 108 maybe wider than the entirety of the space 112 between conductive lines 102a and 102b. For example, at the bottom of space 112, the space 112 narrows to be less than the width of opening 110. As such, when formed, the third conductive line 204 may make physical contact with both conductive line 102a and conductive line 102b.

The presence of the barrier layer 202 may permit the formation of the third conductive line 112 by preventing an electrical connection between the third conductive line 112 and either of conductive lines 102a and 102b. Thus, the formation of the third line 204 may not damage either of the first conductive line 102a or the second conductive line 102b. In addition, the third conductive line 204 does not make an electrical connection (conductive contact) with either of the first conductive line 102a or the second conductive line 102b. Such a third conductive line 204 would therefore be unlikely to cause a short circuit with either of the first conductive line 102a or the second conductive line 102b. In this way, the presence of the barrier layer 202 may prevent problems that may otherwise arise due to misalignment between openings 110 of the patterned photoresist 108 and spaces 112 (e.g., see FIG. 1A and FIG. 1B) between the first conductive line 102a and the second conductive line 102b.

Figure 3:
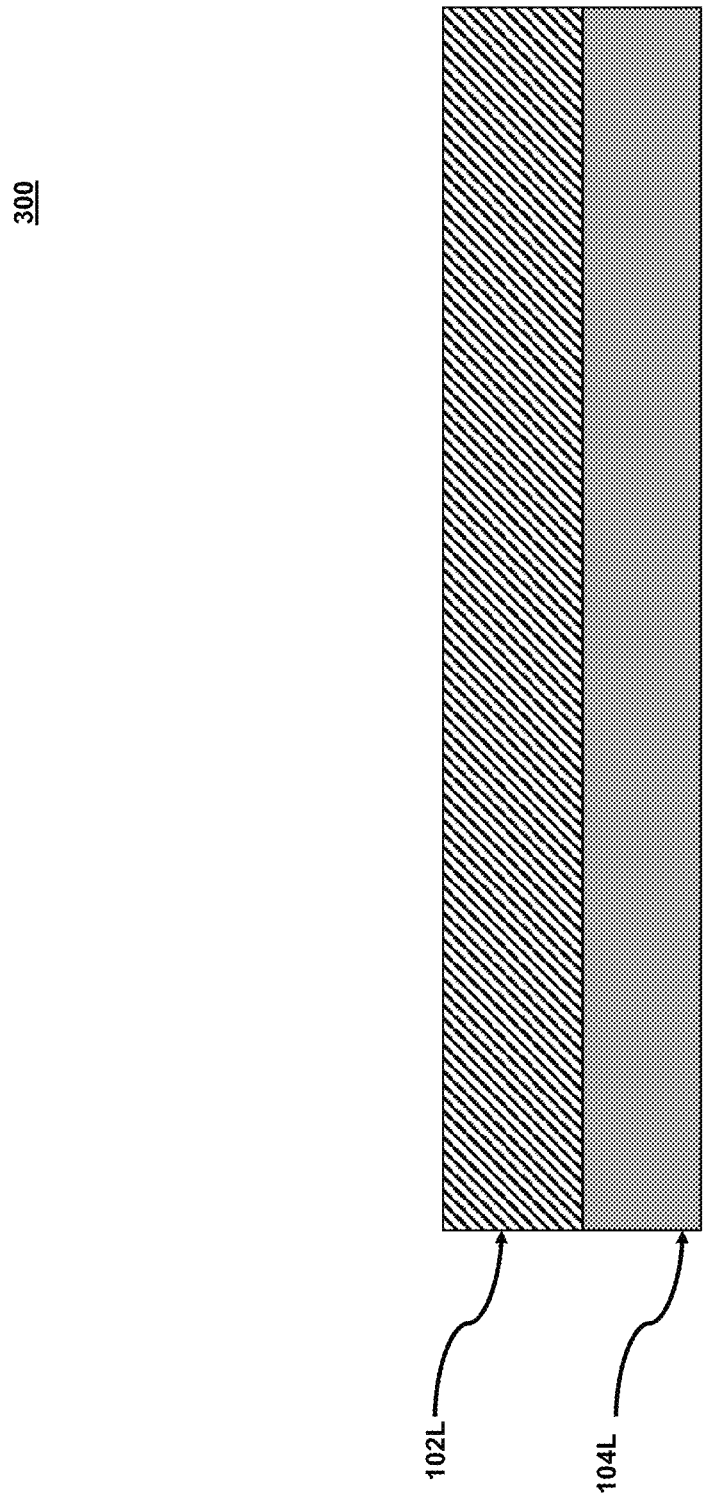
FIG. 3 is a vertical cross-sectional view of an intermediate structure, including a metal layer on a substrate, used in a two-stage patterning/etch process to generate a plurality of conductive lines having increased feature density, according to various embodiments.

FIG. 3 is a vertical cross-sectional view of an intermediate structure 300 used in a two-stage pattern/etch process to generate a plurality of conductive lines having increased feature density, according to various embodiments. The structure 300 includes a metal layer 102L formed over a substrate 104. The substrate 104 may include a bulk semiconductor substrate such as a silicon substrate or a semiconductor-on-insulator layer including the substrate layer 104 as a top semiconductor layer overlying a buried insulator layer (such as a silicon dioxide layer). Alternatively, the substrate layer 104 may be an oxide layer (e.g., silicon dioxide on silicon) that may, for example, be formed over other structures. For example, the substrate layer 104 may be an etch stop dielectric layer that is formed over lower level transistors and structures. The metal layer 102L layer may include any suitable metal, such as copper, aluminum, zirconium, titanium, tungsten, tantalum, ruthenium, palladium, platinum, cobalt, nickel, or alloys thereof. Other suitable materials are within the contemplated scope of this disclosure. The metal layer 102L may be deposited by any suitable technique, such as chemical vapor deposition (CVD), plasma enhanced chemical vapor deposition (PECVD), atomic layer deposition (ALD), etc.

Figure 4:
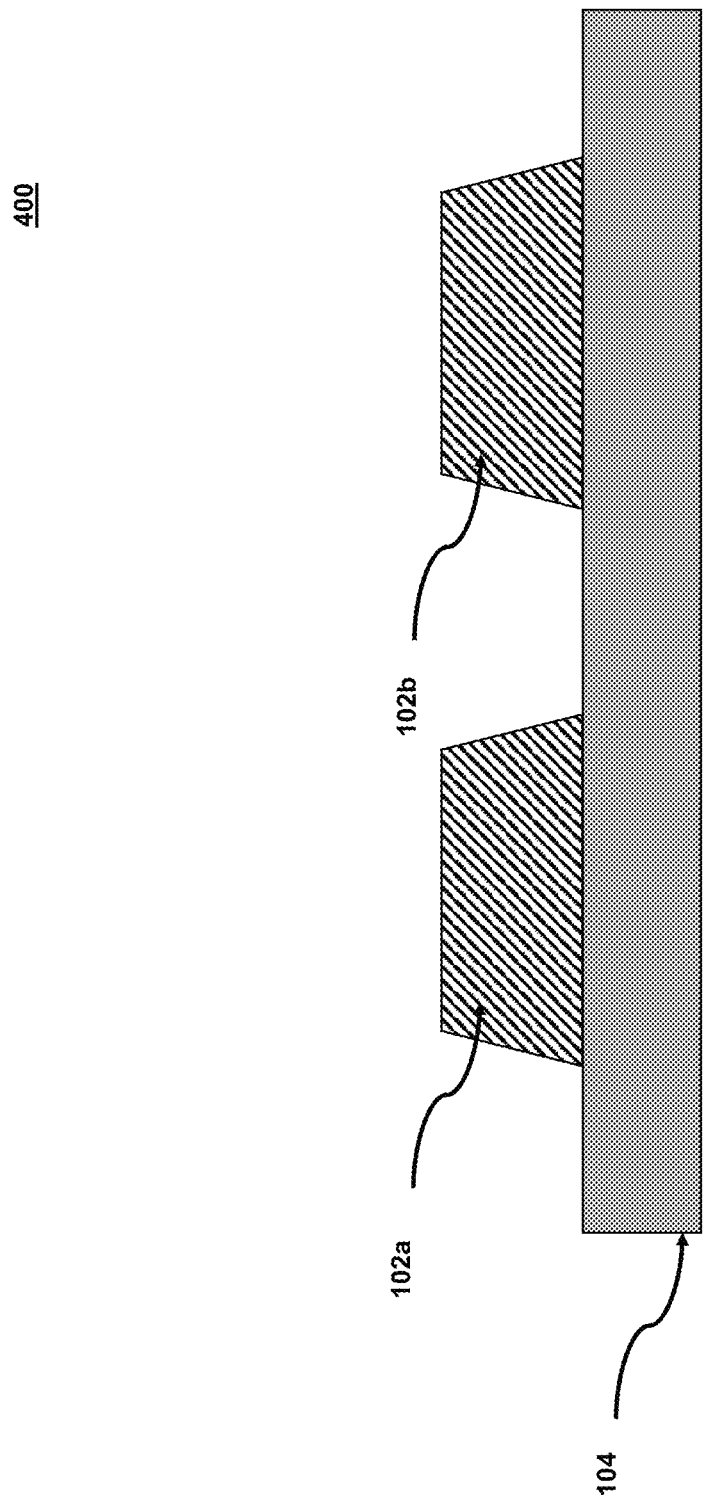
FIG. 4 is a vertical cross-sectional view of a further intermediate structure including a first conductive line and a second conductive line formed by etching the metal layer of the intermediate structure of FIG. 3, according to various embodiments.

FIG. 4 is a vertical cross-sectional view of an intermediate structure 400 including a first conductive line 102a and a second conductive line 102b formed by etching the metal layer 102L of the intermediate structure 300 illustrated in FIG. 3, according to various embodiments. In this regard, a photoresist (not shown) may be deposited over the metal layer 102L of the intermediate structure 300 of FIG. 3. The deposited photoresist may then be patterned using photolithography techniques. The patterned photoresist may then be used as a mask while patterning the metal layer 102L. Patterning of the metal layer 102L may be performed by using an anisotropic etch process to generate the first conductive line 102a and the second conductive line 102b. After etching, any residual photoresist may be removed by ashing or dissolution with a solvent.

Figure 5:
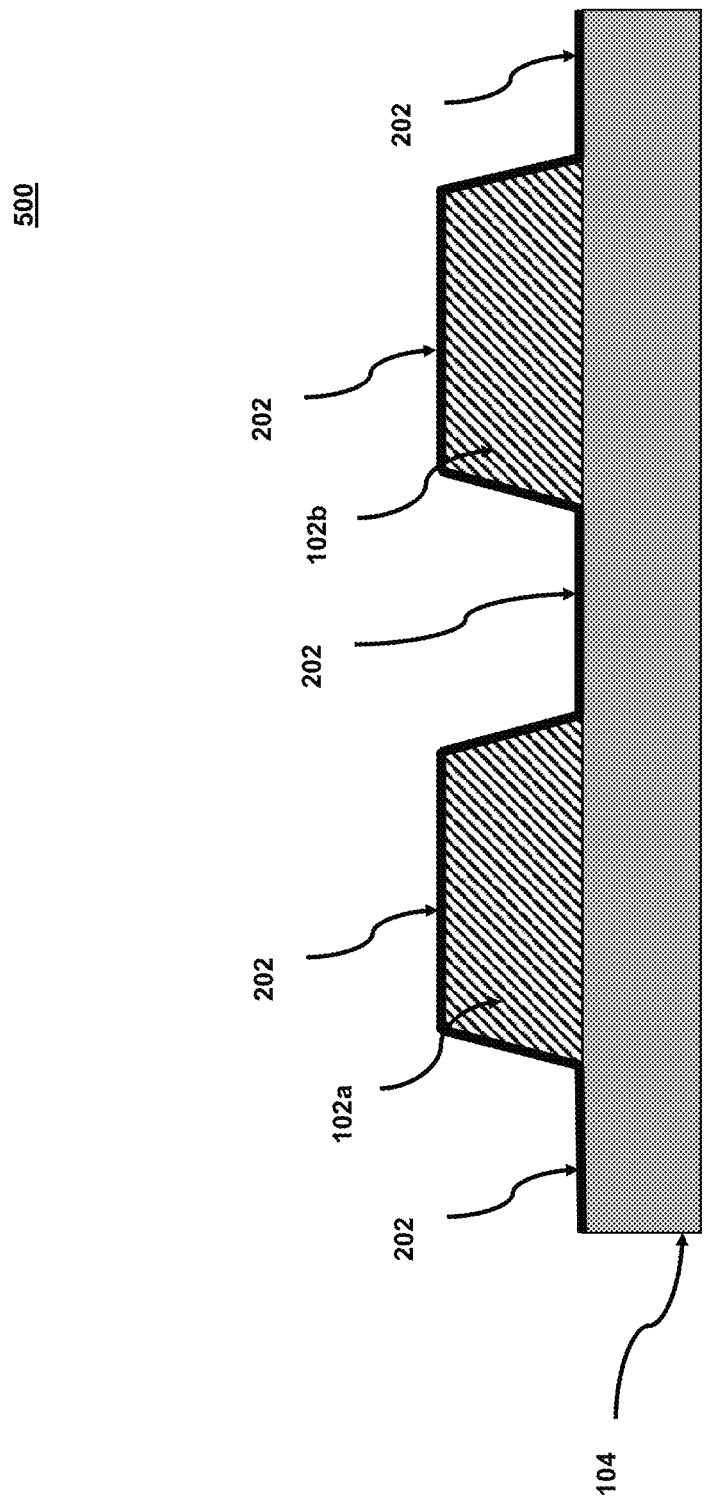
FIG. 5 is a vertical cross-sectional view of a further intermediate structure including a barrier layer formed over the first conductive line and the second conductive line of the intermediate structure of FIG. 4, according to various embodiments.

FIG. 5 is a vertical cross-sectional view of an intermediate structure 500 including a barrier layer 202 formed over the first conductive line 102a and over the second conductive line 102b of the intermediate structure 400 of FIG. 4, according to various embodiments. The barrier layer 202 may also be formed over surfaces of the substrate 104 adjacent to the first conductive line 102a and the second conductive line 102b. The barrier layer 202 may be a dielectric layer including a silicon-containing dielectric material such as silicon nitride, silicon oxynitride, silicon carbide, or silicon carbide nitride. Other suitable barrier layer materials are within the contemplated scope of disclosure. The barrier layer 202 may be deposited by a conformal deposition process. For example, the barrier layer 202 may be formed by CVD, ALD, or physical vapor deposition (PVD). The barrier layer 202 may have a thickness in a range from 2 nm to 20 nm, such as from 3 nm to 12 nm, 5 nm to 10 nm, etc., although lesser and greater thicknesses may also be used in other embodiments.

Figure 6:
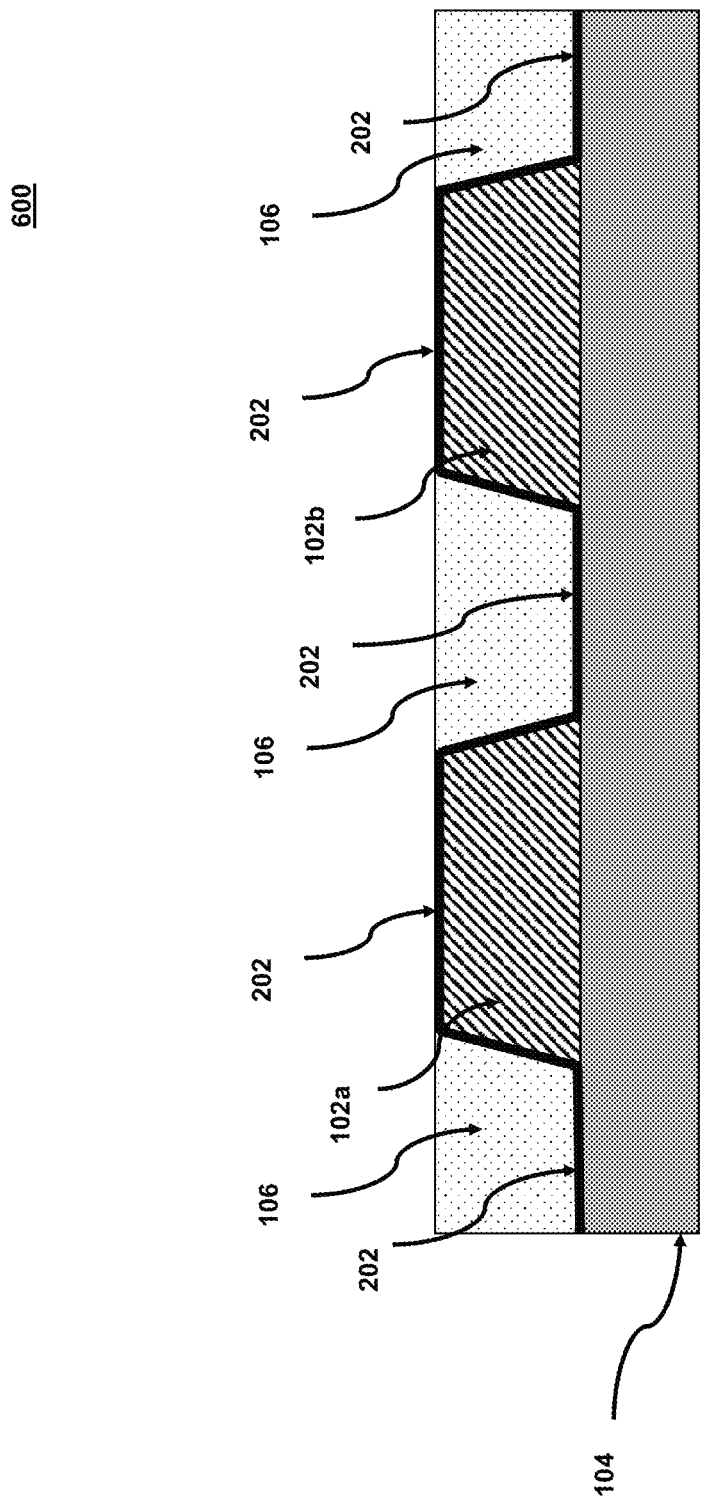
FIG. 6 is a vertical cross-sectional view of a further intermediate structure after formation of an oxide layer over the intermediate structure of FIG. 5, according to various embodiments.

FIG. 6 is a vertical cross-sectional view of an intermediate structure 600 after formation of an insulating layer, for example an oxide layer 106, over the intermediate structure 500 of FIG. 5, according to various embodiments. The intermediate structure 600 may be formed by depositing the oxide layer 106 over portions of the barrier layer 202 of the intermediate structure of FIG. 5. The oxide layer 106 may be formed of a suitable dielectric material, such as silicon dioxide ($SiO_2$) silicon nitride (SiN, $Si_3N_4$), silicon carbide (SiC), undoped silicate glass, a doped silicate glass, organosilicate glass, amorphous fluorinated carbon, porous variants thereof, or combinations thereof. Other insulator materials are within the contemplated scope of disclosure.

The oxide layer 106 may be deposited by a conformal deposition process (such as low pressure CVD) or a self-planarizing deposition process (such as spin coating). Other conformal deposition processes may include PECVC, ALD, PVD, a high density plasma CVD (HDPCVD) process, a metalorganic CVD (MOCVD) process, a sputtering process, laser ablation, etc. Excess portions of the deposited oxide layer 106 may be removed from above the top surface of the structure (i.e., above the portion of the barrier layer 202 covering the top surfaces of the first conductive line 102a and the second conductive line 102b) by a planarization process, for example, by CMP.

Figure 7:
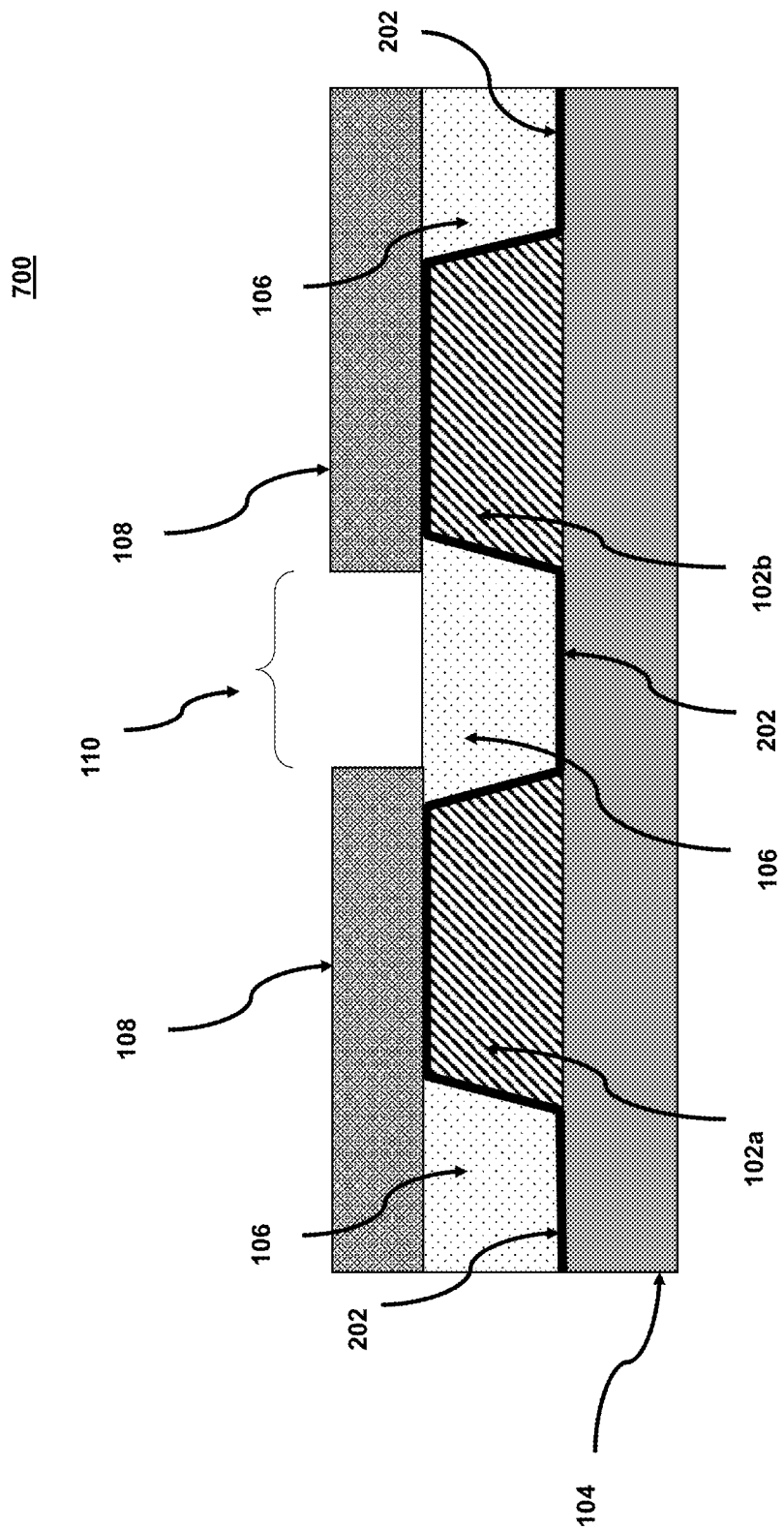
FIG. 7 is a vertical cross-sectional view of a further intermediate structure after formation of a patterned photoresist over the intermediate structure of FIG. 6, according to various embodiments.

FIG. 7 is a vertical cross-sectional view of an intermediate structure 700 after formation of a patterned photoresist 108 over the intermediate structure of FIG. 6, according to various embodiments. The photoresist 108 may be patterned using photolithography techniques to generate openings 110 in the photoresist 108. The patterned photoresist 108 may be used as a mask for patterning the oxide layer 106. An anisotropic etch process may be performed to remove regions the oxide layer 106 to thereby generate a cavity 802 between the first conductive line 102a and the second conductive line 102b, as shown in FIG. 8.

Figure 8:
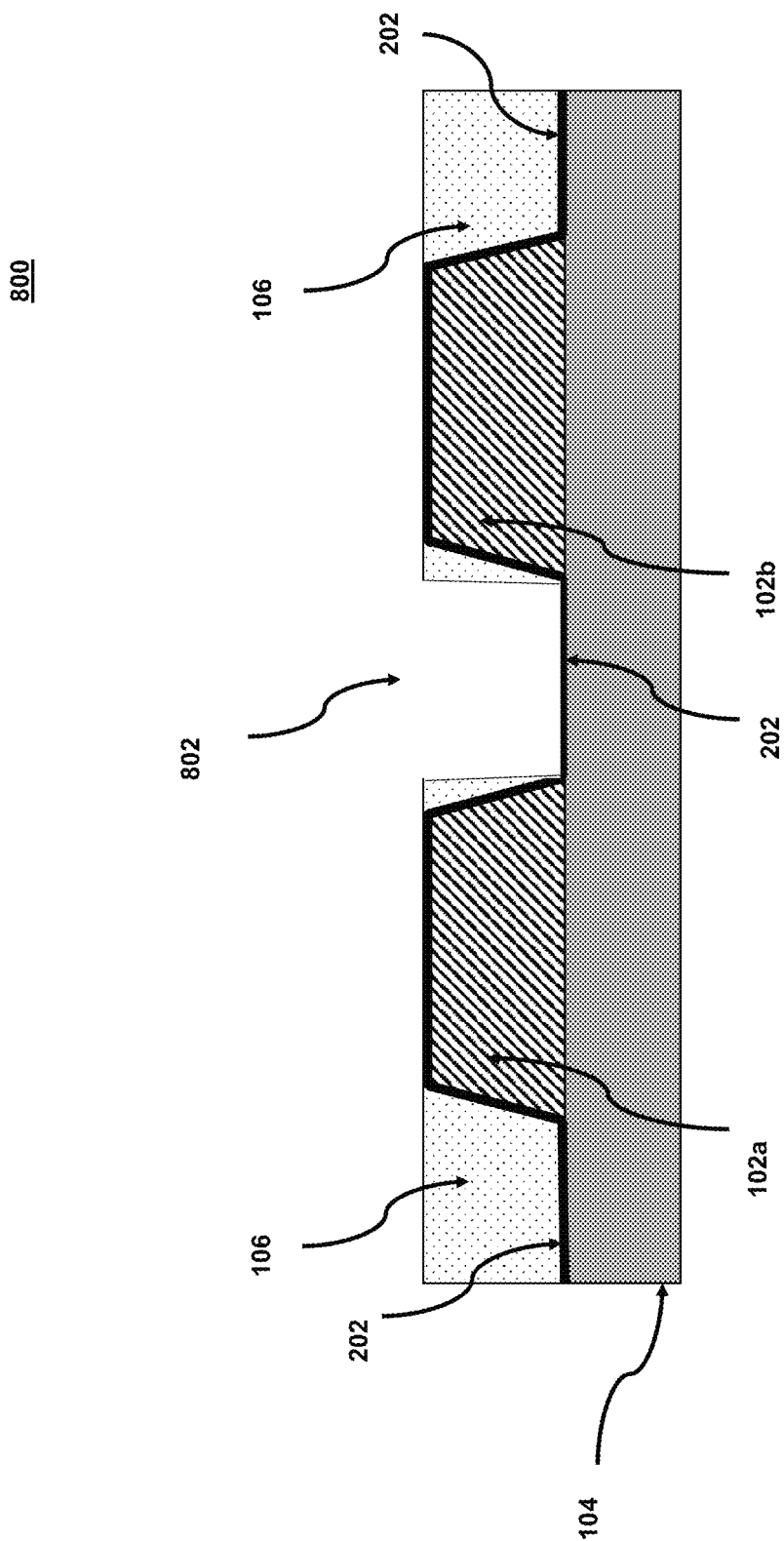
FIG. 8 is a vertical cross-sectional view of a further intermediate structure after performing an anisotropic etch process to remove a portion of the oxide layer of the intermediate structure of FIG. 7, according to various embodiments.

FIG. 8 is a vertical cross-sectional view of an intermediate structure 800 after performing an anisotropic etch process to remove a portion of the oxide layer 106 of the intermediate structure 700 of FIG. 7, according to various embodiments. In this regard, the cavity 802, having a rectangular cross section may be formed by an anisotropic etch. After etching, any residual photoresist 108 may be removed by ashing or dissolution with a solvent. A conductive material may then be deposited in the cavity 802 to form a third conductive line 204, as described in greater detail below with reference to FIG. 9.

Figure 9:
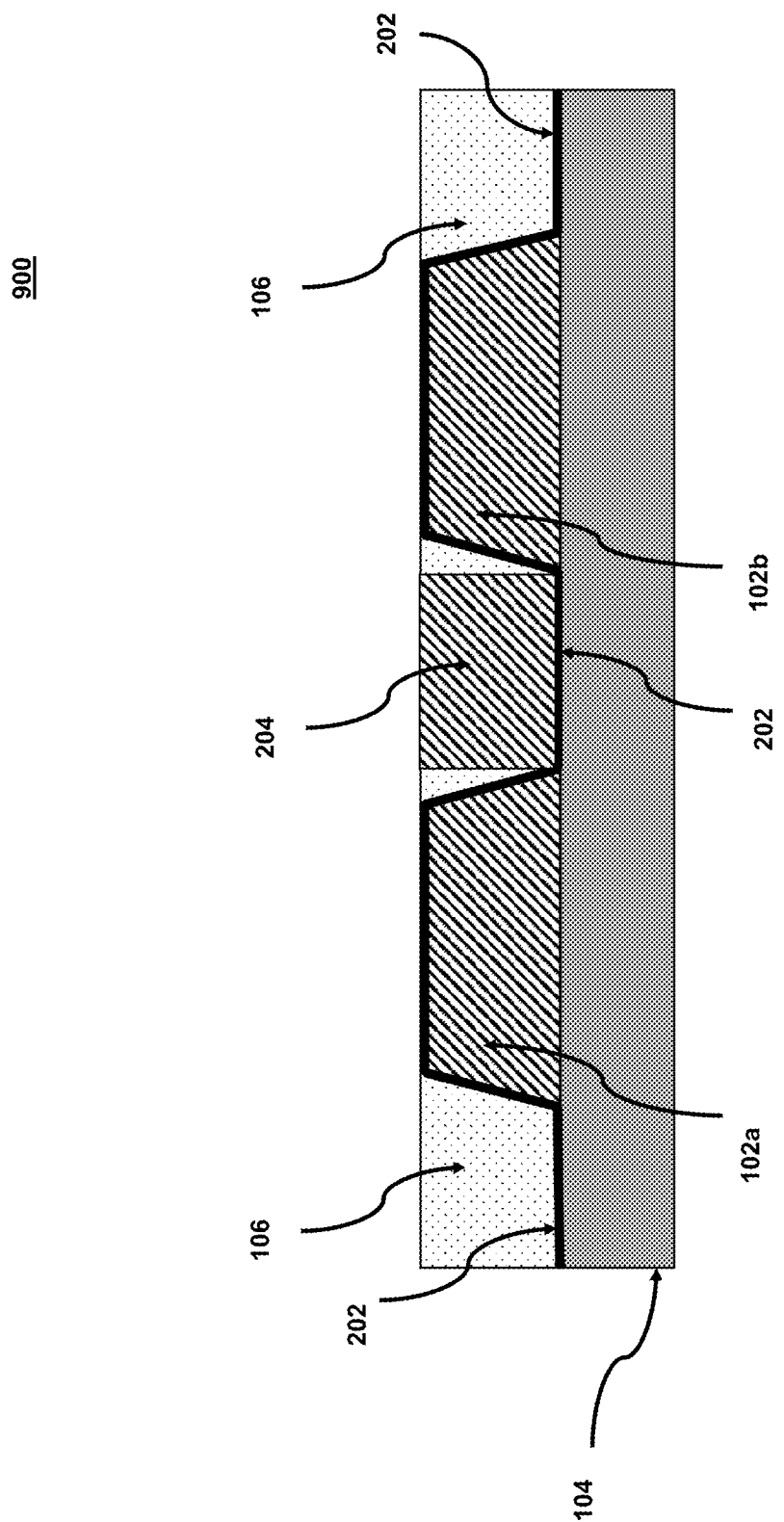
FIG. 9 is a vertical cross-sectional view of a structure formed by deposition of a conductive material in the cavity of the intermediate structure of FIG. 8, according to various embodiments.

FIG. 9 is a vertical cross-sectional view of an embodiment structure 900 formed by deposition of a conductive material in the cavity 802 of the intermediate structure 800 of FIG. 8, according to various embodiments. In this regard, structure 900 has three conductive lines including the first conductive line 102a and the second conductive line 102b, formed by a first patterning/etch process (e.g., described above with reference to FIGS. 3 to 6), and a third newly formed conductive line 204 formed by a second patterning/etch process (e.g., described above with reference to FIGS. 7 and 8). As such, structure 900 is similar to structure 200, described above with reference to FIG. 2. The presence of the barrier layer 202 removes a need for the openings 110 (e.g., see FIG. 7) to be perfectly aligned relative to the first conductive line 102a and the second conductive line 102b. Further, the presence of the barrier layer 202 allows the third conductive line 204 to closely fit within the space (e.g., cavity 802 of FIG. 8) between the first conductive line 102a and the second conductive line 102b, with reduced risk of a short circuit forming between the third conductive line 204 and either of the first conductive line 102a or the second conductive line 102b.

The conductive material deposited in the cavity 802 (e.g., see FIG. 8) to form the third conductive line 204 (e.g., see FIG. 9) may include a metallic liner material and a metallic fill material. The metallic liner material may include a conductive metallic nitride or a conductive metallic carbide such as TiN, TaN, WN, TiC, TaC, and/or WC. The metallic fill material may include W, Cu, Al, Co, Ru, Mo, Ta, Ti, alloys thereof, and/or combinations thereof. Other suitable metallic liner and metallic fill materials within the contemplated scope of this disclosure may also be used.

The metallic liner material and metallic fill materials may be formed by suitable deposition process, which may include one or more of a CVD process, a PVD process, an ALD process, an electroplating process, etc. Other suitable deposition processes are within the contemplated scope of disclosure. Excess portions of the conductive material may be removed from above a horizontal plane including the top surface of the barrier layer 202 (i.e., above the portion of the barrier layer 202 covering the top surfaces of the first conductive line 102a and the second conductive line 102b), by a planarization process. The planarization process may include use of a CMP process although other suitable planarization processes may be used. Thus, the third conductive line 204 may be separated from the first conductive line 102a and the second conductive line 102b by both a remaining oxide layer 106 and barrier layer 202.

Figure 10:
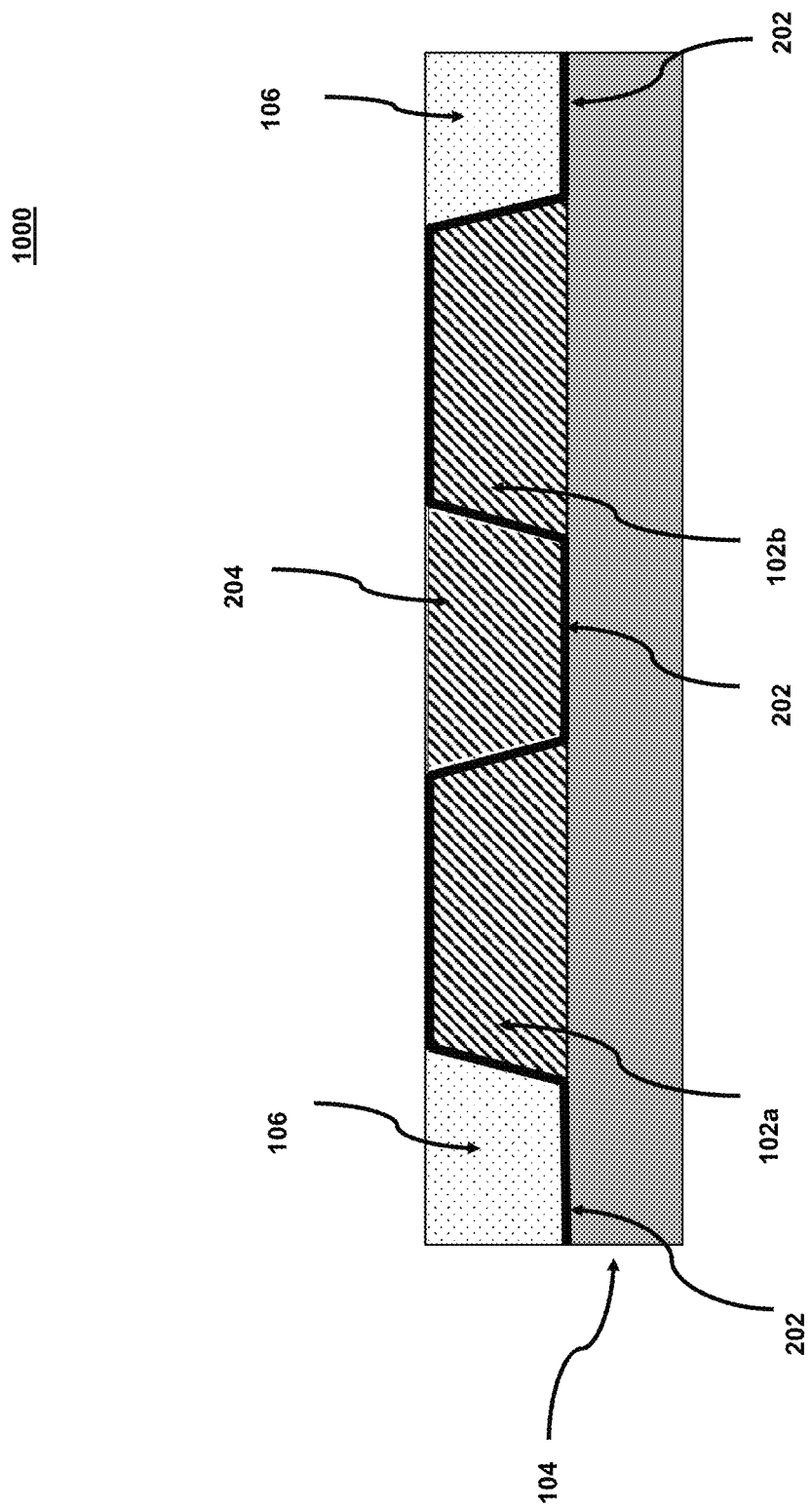
FIG. 10 is a vertical cross-sectional view of a structure having three closely-spaced conductive lines formed by a first patterning/etch process followed by a second patterning/etch process, according to various embodiments.

FIG. 10 is a vertical cross-sectional view of an embodiment structure 1000 having three closely-spaced conductive lines formed by a first patterning/etch process followed by a second patterning/etch process, according to various embodiments. Structure 1000 may be formed by a process that is similar to that which was used to form the structure 900 of FIG. 9, as described above with reference to FIGS. 3 to 9. In this regard, a metal layer 102L (e.g., see FIG. 3) may be etched to form a first conductive line 102a and a second conductive line 102b (e.g., see FIG. 4). As described above, this process may include forming a patterned photoresist (not shown) over metal layer 102L. The patterned photoresist is then used to etch unmasked regions of the metal layer 102L to thereby form the first conductive line 102a and the second conductive line 102b.

A barrier layer 202 may then be formed over the first conductive line 102a, over the second conductive line 102b, and over surfaces of the substrate 104 adjacent to the first conductive line 102a and the second conductive line 102b, as described above with reference to FIG. 5. The barrier layer 202 may be a dielectric layer including a silicon-containing dielectric material such as silicon nitride, silicon oxynitride, silicon carbide, or silicon carbide nitride. The barrier layer 202 may be formed by CVD, ALD, or PVD.

An insulating layer, for example an oxide layer 106, may be deposited by a conformal deposition process (such as low pressure CVD) or a self-planarizing deposition process (such as spin coating), as described above with reference to FIG. 6. Other conformal deposition processes may include PECVC, ALD, PVD, HDPCVD process, MOCVD, sputtering, laser ablation, etc. Excess portions of the deposited oxide layer 106 may be removed from above the top surface of the structure (i.e., above the portion of the barrier layer 202 covering the top surfaces of the first conductive line 102a and the second conductive line 102b) by a planarization process, for example, by CMP.

After deposition of the oxide layer 106, a patterned photoresist 108 may be deposited over the structure, as described above with FIG. 7. The photoresist 108 may be patterned using photolithography techniques to generate openings 110 in the photoresist 108. The patterned photoresist 108 may be used as a mask for patterning the oxide layer 106. An anisotropic etch process may be performed to remove regions the oxide layer 106 to thereby generate a cavity (e.g., cavity 802 of FIG. 8) between the first conductive line 102a and the second conductive line 102b.

In contrast to the patterned photoresist 108 of FIG. 7, larger photoresist openings (not shown) may be used for the fabrication of the structure 1000 of FIG. 10. In this regard, the photoresist openings may be made sufficiently large so that all of the oxide layer 106 between the first conductive line 102a and the second conductive line 102b may be removed. In this regard, an isotropic etch or an anisotropic etch may be used to remove all of the oxide layer 106 between the first conductive line 102a and the second conductive line 102b. A third conductive line 204 may then be formed by deposition of a conductive material in the space between the first conductive line 102a and the second conductive line 102b, as shown in FIG. 10. The conductive material may include a metallic liner material and a metallic fill material.

As shown in FIG. 10, the third conductive line 204 may be formed by substantially filling the entirety of the space between the first conductive line 102a and the second conductive line 102b. As such, the third conductive line 204 may be separated from the first conductive line 102a by the barrier layer 202. Similarly, the third conductive line 204 is separated from the second conductive line 102b by the barrier layer 202. As described above, the barrier layer 202 may have a thickness in a range from 2 nm to 20 nm, such as from 3 nm to 12 nm, 5 nm to 10 nm, etc., although lesser and greater thicknesses may also be used in other embodiments. Such close spacing between the first conductive line 102a, the second conductive line 102b, and third conductive line 204 would not be possible without the presence of the barrier layer 202. In further embodiments, described below with reference to FIG. 12, it may be advantageous to further include one or more additional barrier layers 1202 to tune the electrical characteristics (e.g., RC delay) of the first conductive line 102a, the second conductive line 102b, and the third conductive line 204.

Figure 11:
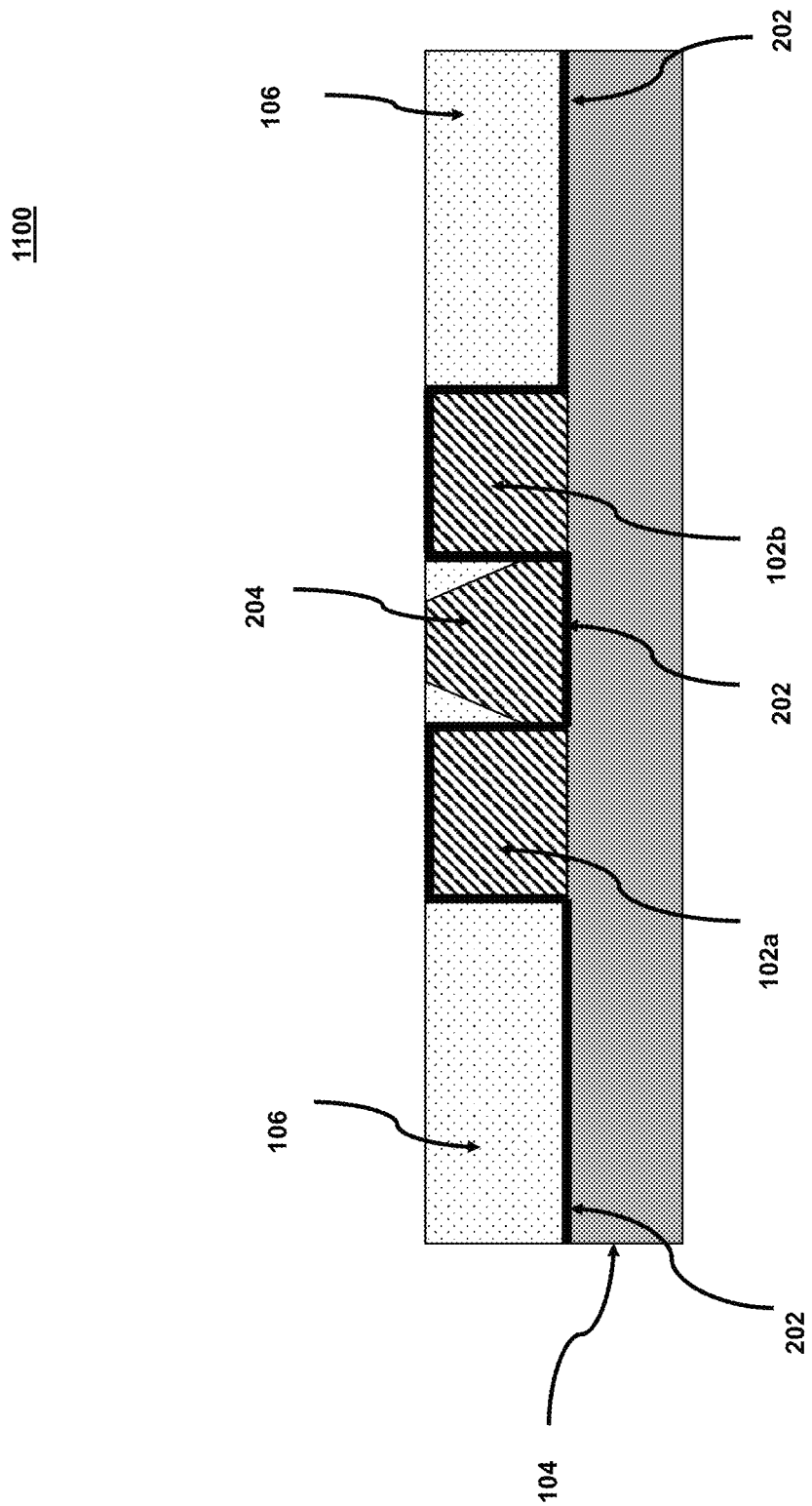
FIG. 11 is a vertical cross-sectional view of a further structure having three closely-spaced conductive lines formed by a first patterning/etch process followed by a second patterning/etch process, according to various embodiments.

FIG. 11 is a vertical cross-sectional view of another embodiment structure 1100 having three closely-spaced conductive lines formed by a first patterning/etch process followed by a second patterning/etch process, according to various embodiments. Comparison of structures 900, 1000, and 1100, illustrated in FIGS. 9, 10, and 11, respectively, shows that the three conductive lines may have various different shapes. For example, structure 900 includes the first conductive line 102a and the second conductive line 102b, which each have a trapezoidal cross section, while the third conductive line 204 may have a rectangular shaped cross section. In contrast, the structure 1000 of FIG. 10 includes the first conductive line 102a and the second conductive line 102b, which each have a trapezoidal cross section, while the third conductive line 204 has a trapezoidal shape which is complementary to the shape of the first conductive line 102a and the second conductive line 102b. In this regard, the shape of the third conductive line 204 may be inverted relative to the shapes of the first conductive line 102a and the second conductive line 102b so that the third conductive line 204 closely fits in the space between the first conductive line 102a and the second conductive line 102b.

The structure 1100 of FIG. 11 includes a first conductive line 102a and a second conductive line 102b, which each have a rectangular cross section, while the third conductive line 204 has a trapezoidal cross section. Further, as shown in FIG. 11, the shape of the third conductive line 204 has a truncated trapezoidal shape such that a first edge of the third conductive line 204 (i.e., on the left side of the third conductive line 204 in FIG. 11) is in contact with the barrier layer 202 on the first conductive line 102a and a second edge of the third conductive line 204 (i.e., on the right side of the third conductive line 204 in FIG. 11) is in contact with the barrier layer 202 on the second conductive line 102b.

As with the structure 1000 of FIG. 10, the structure 1100 of FIG. 11 may be fabricated using processes similar to those processes described above with reference to FIGS. 3 to 9. In this regard, a metal layer 102L (e.g., see FIG. 3) may be etched to form a first conductive line 102a and a second conductive line 102b (e.g., see FIG. 4). As described above, this process may include forming a patterned photoresist (not shown) over metal layer 102L. The patterned photoresist may then be used to etch unmasked regions of the metal layer 102L to thereby form the first conductive line 102a and the second conductive line 102b.

A barrier layer 202 may then be formed over the first conductive line 102a, over the second conductive line 102b, and over surfaces of the substrate 104 adjacent to the first conductive line 102a and the second conductive line 102b. This process is similar to the process described above with reference to FIG. 5. The barrier layer 202 may be a dielectric layer including a silicon-containing dielectric material such as silicon nitride, silicon oxynitride, silicon carbide, or silicon carbide nitride. The barrier layer 202 may be formed by CVD, ALD, or PVD.

A replacement process may be performed to generate the third conductive line 204, which has a shape that is wider at the bottom than at the top. In this regard, a sacrificial structure (not shown) having a desired shape (e.g., a trapezoid) may first be formed in the space between the first conductive line 102a and the second conductive line 102b. The sacrificial structure may be formed by depositing and patterning a sacrificial material to form the sacrificial structure. An oxide layer 106 may then be formed over the sacrificial structure. The oxide layer 106 may then be planarized and patterned to reveal a top surface of the sacrificial structure. The sacrificial material may then be removed to form a cavity having the desired shape (e.g., a trapezoid that is wider at the bottom). The third conductive line 204, having the desired shape, may then be formed by deposition of a conductive material in the cavity.

In various embodiments, the sacrificial material may include amorphous silicon, an amorphous semiconductor compound (e.g., SiGe), amorphous carbon, etc. The sacrificial material may be removed using various etching processes. For example, amorphous semiconductor materials may be removed by a wet etch process, for example, using hot trimethyl-2 hydroxyethyl ammonium hydroxide ("hot TMY") or tetramethyl ammonium hydroxide (TMAH), which amorphous carbon may be removed by ashing.

As described above with reference to other embodiments, the oxide layer 106, may be deposited by a conformal deposition process (such as low pressure CVD) or a self-planarizing deposition process (such as spin coating), as described above with reference to FIG. 6. Other conformal deposition processes may include PECVC, ALD, PVD, HDPCVD process, MOCVD, sputtering, laser ablation, etc. Excess portions of the deposited oxide layer 106 may be removed from above the top surface of the structure (i.e., above the portion of the barrier layer 202 covering the top surfaces of the first conductive line 102a and the second conductive line 102b) by a planarization process, for example, by CMP.

After deposition of the oxide layer 106, a patterned photoresist may be deposited over the structure (e.g., see patterned photoresist 108 as described above with FIG. 7). The patterned photoresist 108 may be used as a mask for patterning the oxide layer 106. An anisotropic etch process may be performed to remove portions of the oxide layer 106 to reveal a top surface of the sacrificial layer (not shown), as described above. The sacrificial structure may then be removed to thereby generate a cavity (not shown) between the first conductive line 102a and the second conductive line 102b. A third conductive line 204 may then be formed by deposition of a conductive material in the cavity between the first conductive line 102a and the second conductive line 102b, as shown in FIG. 11. In some embodiments, the resulting third conductive line 204 may include voids (not shown) of various shapes (e.g., triangular voids).

Figure 12:
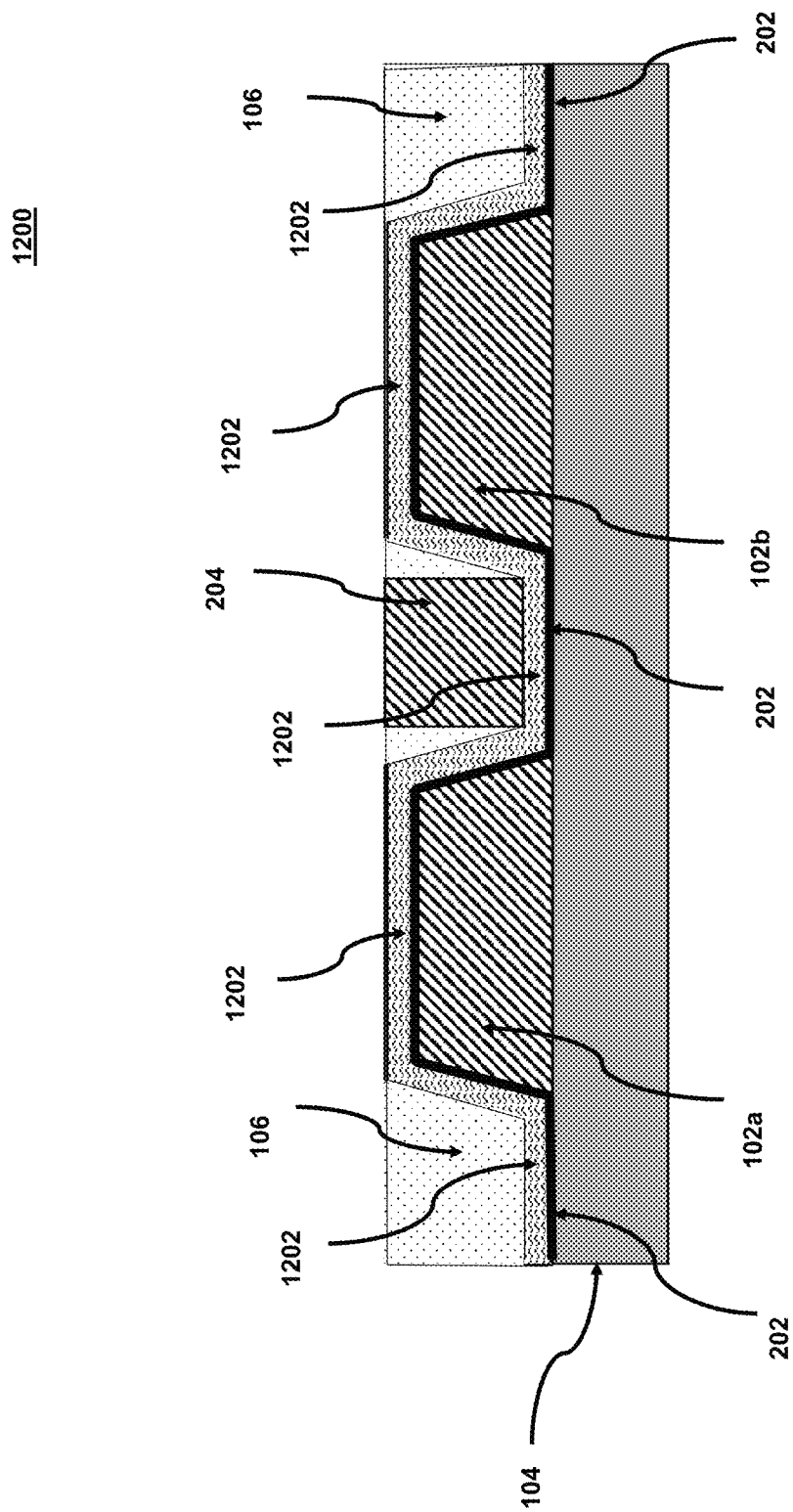
FIG. 12 is a vertical cross-sectional view of a further structure having three closely-spaced conductive lines formed by a first patterning/etch process followed by a second patterning/etch process, according to various embodiments.

FIG. 12 is a vertical cross-sectional view of another embodiment structure 1200 having three closely-spaced conductive lines formed by a first patterning/etch process followed by a second patterning/etch process, according to various embodiments. Structure 1200 of FIG. 12 is similar to structure 900 of FIG. 9 in that structure 1200 includes a substrate 104, first conductive line 102a, a second conductive line 102b, a third conductive line 204, a barrier layer 202, and an oxide layer 106. However, structure 1200 of FIG. 12 further includes a second barrier layer 1202. As mentioned above, it may be advantageous to include the second barrier layer 1202 to allow various electrical characteristics of the structure 1200 (e.g., RC delay) to be adjusted. In this regard, the first barrier layer 202 may be chosen to be a low dielectric constant (low-k) material, while the second barrier layer 1202 may be chosen to be a high selectivity barrier material.

Structure 1200 may be formed by a process that is similar to that which was used to form the structure 900 of FIG. 9, as described above with reference to FIGS. 3 to 9. In this regard, a metal layer 102L (e.g., see FIG. 3) may be etched to form a first conductive line 102a and a second conductive line 102b (e.g., see FIG. 4). As described above, this process may include forming a patterned photoresist (not shown) over metal layer 102L. The patterned photoresist may then be used to etch unmasked regions of the metal layer 102L to thereby form the first conductive line 102a and the second conductive line 102b.

A first barrier layer 202 may then be formed over the first conductive line 102a, over the second conductive line 102b, and over surfaces of the substrate 104 adjacent to the first conductive line 102a and the second conductive line 102b, as described above with reference to FIG. 5. The material chosen for the first barrier layer 202 may be a low-k dielectric material. Next, as mentioned above, a second barrier layer 1202 may be formed over the first barrier layer 202. The remaining processing stages in the fabrication of structure 1200 of FIG. 12 are similar to those used in the formation of structure 900 of FIG. 9, as follows.

An insulating layer, for example an oxide layer 106, may then be deposited by a conformal deposition process (such as low pressure CVD) or a self-planarizing deposition process (such as spin coating), as described above with reference to FIG. 6. Other conformal deposition processes may include PECVC, ALD, PVD, HDPCVD process, MOCVD, sputtering, laser ablation, etc. Excess portions of the deposited oxide layer 106 may be removed from above the top surface of the structure (i.e., above the portion of the barrier layer 202 covering the top surfaces of the first conductive line 102a and the second conductive line 102b) by a planarization process, for example, by CMP.

After deposition of the oxide layer 106, a patterned photoresist 108 may be deposited over the structure, as described above with FIG. 7. The photoresist 108 may be patterned using photolithography techniques to generate openings 110 in the photoresist 108. The patterned photoresist 108 may be used as a mask for patterning the oxide layer 106. An anisotropic etch process may be performed to remove regions the oxide layer 106 to thereby generate a cavity 802 (e.g., see FIG. 8) between the first conductive line 102a and the second conductive line 102b. A conductive material may then be deposited in the cavity 802.

The conductive material deposited in the cavity 802 (e.g., see FIG. 8) to form the third conductive line 204 (e.g., see FIG. 9) may include a metallic liner material and a metallic fill material. Embodiment structures 900 to 1200, described above with reference to FIGS. 9 to 12, may be fabricated with methods that employ a first patterning/etch process followed by a second patterning etch process. Such methods allow formation of interconnects having an increased feature density. For example, disclosed embodiments may be used to generate a plurality of conductive lines having a feature pitch that is below the resolution limit of an optical projection system.

In this regard, first and second pluralities of conductive lines may each have a first pitch that separates adjacent lines in the respective first and second pluralities of conductive lines. The first pitch may be chosen to the smallest feature size corresponding to a resolution limit of an optical projection system used to generate the first and second pluralities of conductive lines. The second plurality of lines may be generated to be located within spaces formed between adjacent conductive lines in the first plurality of conductive lines. In this way, the resulting combined set of conductive lines (i.e., a set including the first and second pluralities of conductive lines) has a second pitch that is half of the first pitch, that is, the second pitch is half the minimum feature size determined by the resolution limit of an optical projection system used to generate the first and second pluralities of lines. Similar techniques may be used in the fabrication of a thin film transistor (TFT) structure, as described in greater detail with reference to FIGS. 13 to 18, below.

Figure 13:
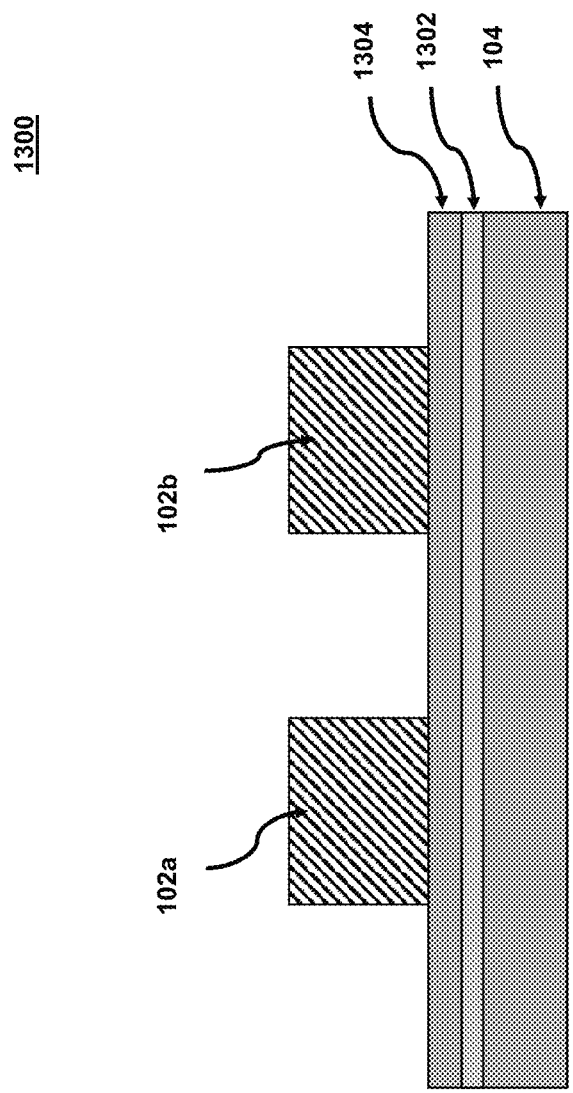
FIG. 13 is a vertical cross-sectional view of an intermediate structure used in the formation of a thin film transistor (TFT) structure, according to various embodiments.

FIG. 13 is a vertical cross-sectional view of an intermediate structure 1300 used in the formation of a thin film transistor (TFT) structure, according to various embodiments. Structure 1300 includes a substrate layer 104, a first super-barrier layer 1302 and a second super-barrier layer 1304, a first conductive line 102a, and a second conductive line 102b. The first conductive line 102a and the second conductive line 102b may be formed by patterning a metal layer as described above with reference to FIGS. 3 and 4. The substrate layer 104 may include a bulk semiconductor substrate such as a silicon substrate or a semiconductor-on-insulator layer including the substrate layer 104 as a top semiconductor layer overlying a buried insulator layer (such as a silicon dioxide layer). Alternatively, the substrate layer 104 may be an oxide layer (e.g., silicon dioxide on silicon). The first super-barrier layer 1302 and the second super-barrier layer 1304 may include metal oxides or metal nitrides. For example, one or both of the first super-barrier layer 1302 and the second super-barrier layer 1304 may include aluminum oxide.

Figure 14:
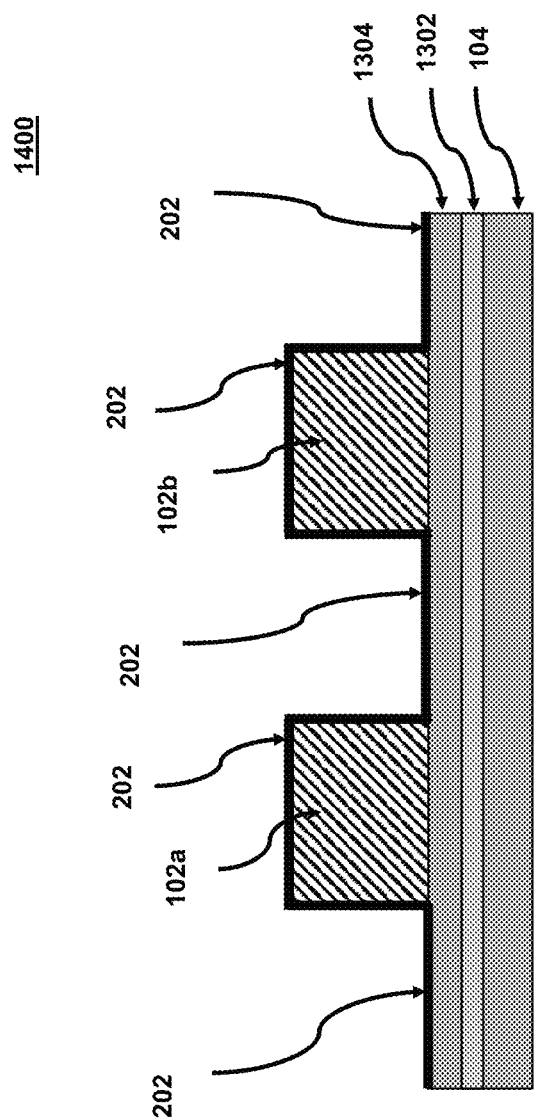
FIG. 14 is a vertical cross-sectional view of a further intermediate structure including a barrier layer formed over the first conductive line and the second conductive line of the intermediate structure of FIG. 13, according to various embodiments.

FIG. 14 is a vertical cross-sectional view of an intermediate structure 1400 including a barrier layer 202 formed over the first conductive line 102b and the second conductive line 102b of the intermediate structure 1300 of FIG. 13, according to various embodiments. The barrier layer 202 may also be formed over surfaces of the second super-barrier layer 1304 adjacent to the first conductive line 102a and the second conductive line 102b.

Figure 15:
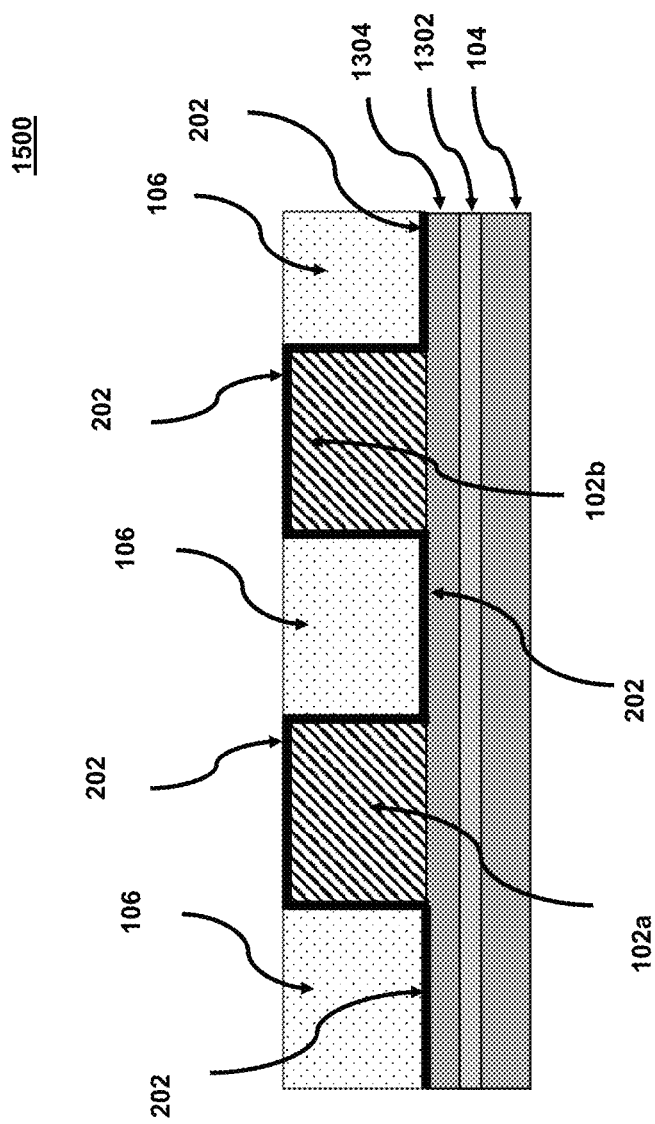
FIG. 15 is a vertical cross-sectional view of a further intermediate structure after formation of an oxide layer over the intermediate structure of FIG. 14, according to various embodiments.

FIG. 15 is a vertical cross-sectional view of an intermediate structure 1500 after formation of an oxide layer 106 over the intermediate structure 1400 of FIG. 14, according to various embodiments. The intermediate structure 1500 is formed by depositing an oxide layer 106 over portions of the barrier layer 202 of the intermediate structure of FIG. 14. The oxide layer 106 may be deposited by a conformal deposition process (such as low pressure CVD) or a self-planarizing deposition process (such as spin coating). Excess portions of the deposited oxide layer 106 may be removed from above the top surface of the structure (i.e., above the portion of the barrier layer 202 covering the top surfaces of the first conductive line 102a and the second conductive line 102b) by a planarization process, for example, by CMP.

Figure 16:
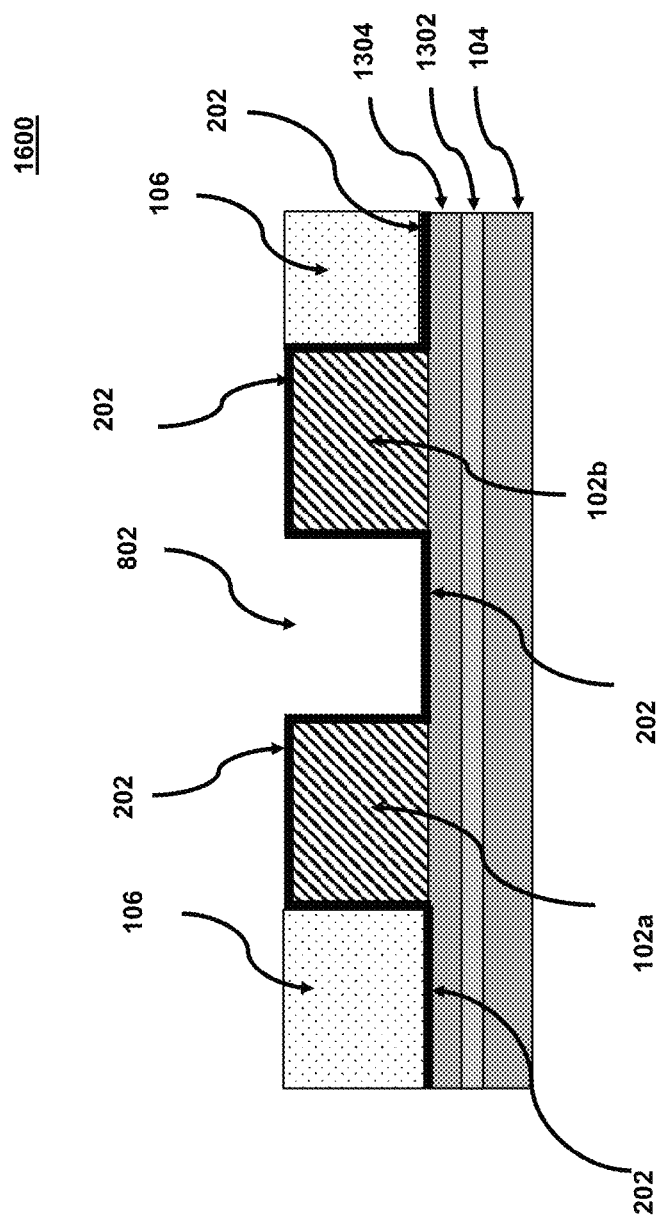
FIG. 16 is a vertical cross-sectional view of a further intermediate structure after an anisotropic etch process has been performed to remove a portion of the oxide layer of the intermediate structure of FIG. 15, according to various embodiments.

FIG. 16 is a vertical cross-sectional view of an intermediate structure 1600 after an anisotropic etch process has been performed to remove a portion of the oxide layer 202 of the intermediate structure 1500 of FIG. 15, according to various embodiments. In this regard, a photoresist (not shown) may be formed over the structure and the photoresist may be patterned using photolithography techniques. The patterned photoresist may then be used to etch a portion of the oxide layer 106 to thereby generate a cavity 802 having a rectangular cross section, as shown in FIG. 16. After etching, any residual photoresist may be removed by ashing or dissolution with a solvent. A conductive material may then be deposited in the cavity 802 to form an third conductive line 204, as described in greater detail below with reference to FIG. 17.

Figure 17:
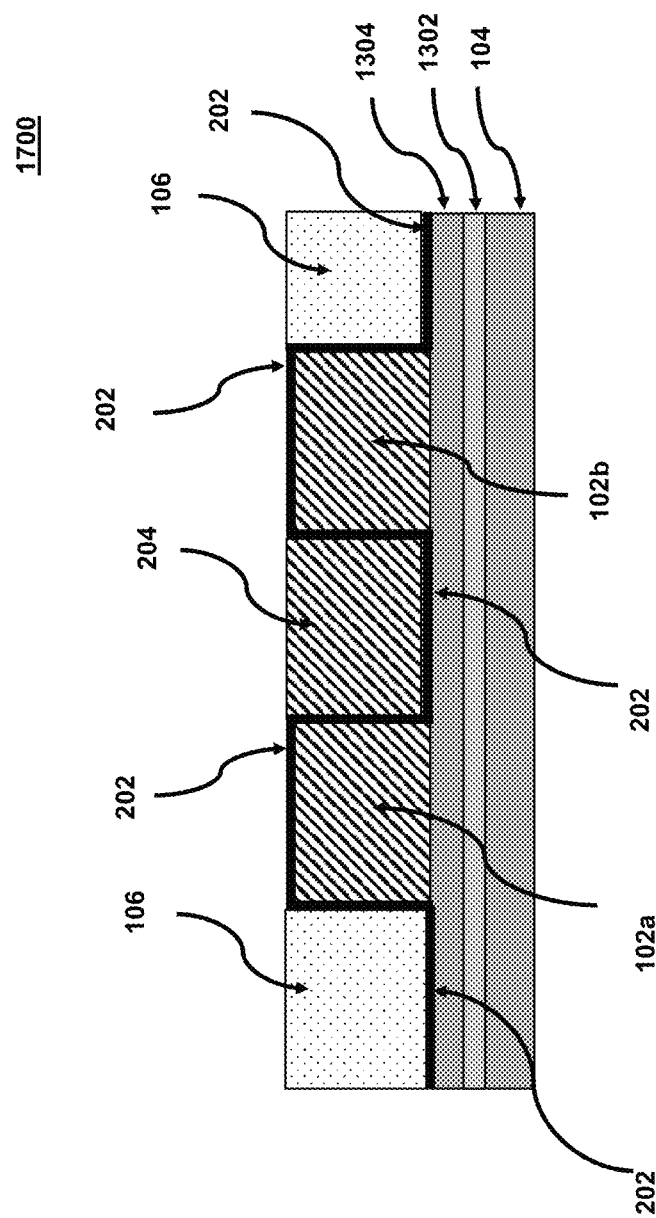
FIG. 17 is a vertical cross-sectional view of a further intermediate structure formed by deposition of a conductive material in the cavity of the intermediate structure of FIG. 16, according to various embodiments.

FIG. 17 is a vertical cross-sectional view of an intermediate structure 1700 formed by deposition of a conductive material in the cavity 802 of the intermediate structure 1600 of FIG. 16, according to various embodiments. In this regard, structure 1700 has three conductive lines including the first conductive line 102a, the second conductive line 102b, and the third conductive line 204. The presence of the barrier layer 202 allows the third conductive line 204 to closely fit within the space (e.g., cavity 802 of FIG. 16) between the first conductive line 102a and the second conductive line 102b, with reduced risk of a short circuit forming between the third conductive line 204 and either of the first conductive line 102a or the second conductive line 102b. The conductive material deposited in the cavity 802 (e.g., see FIG. 16) to form the third conductive line 204 (e.g., see FIG. 17) may include a metallic liner material and a metallic fill material.

Figure 18:
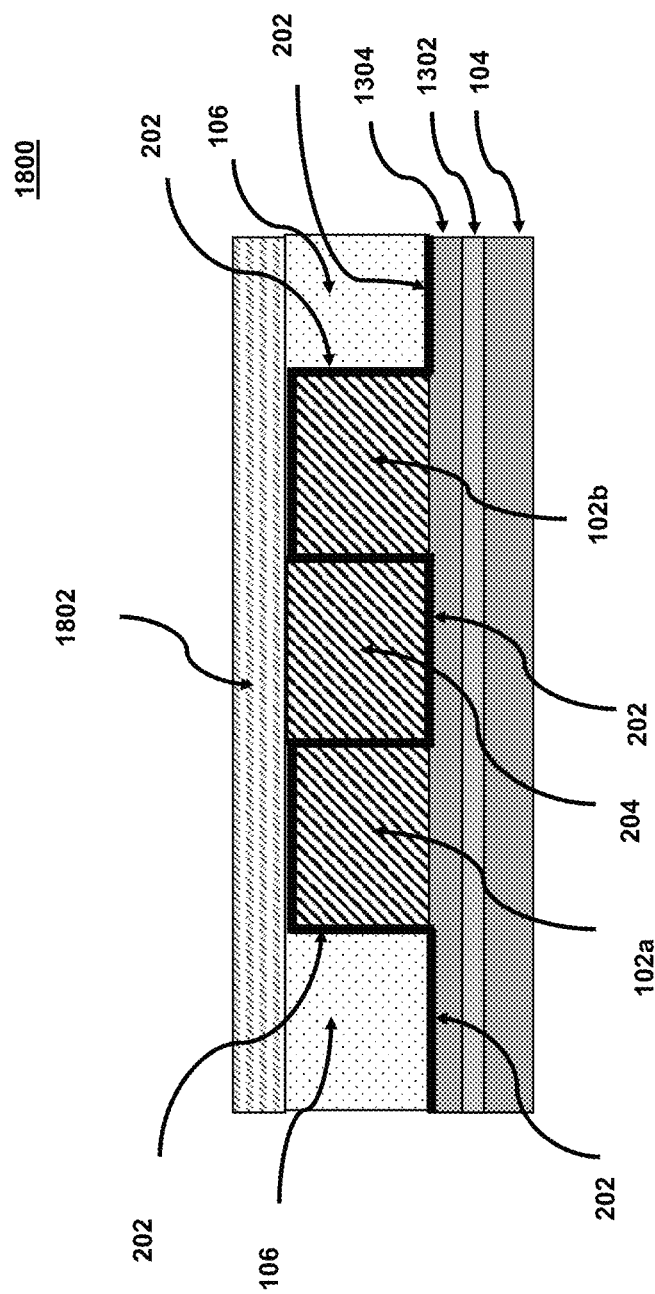
FIG. 18 illustrates a TFT structure formed by depositing a semiconductor layer over the intermediate structure of FIG. 17, according to various embodiments.

FIG. 18 illustrates a TFT structure 1800 formed by depositing a semiconductor layer 1802 over the intermediate structure 1700 of FIG. 17, according to various embodiments. The first conductive line 102a and the second conductive line 102b may be configured to act as gate electrodes in the TFT structure 1800, while the third conductive line 204 may be configured as a contact (i.e., source contact or drain contact) of the TFT structure 1800.

The semiconductor layer 1802 may be configured as a channel layer for the TFT structure 1800 and may include at least one of amorphous silicon or a semiconducting oxide, such as InGaZnO, InWO, InZnO, InSnO, GaO, InO, etc. Other suitable semiconductor materials are within the contemplated scope of disclosure. For example, semiconductor layer 1802 may include a laminated structure including layers of $In_xGa_yZn_zO$ with different concentrations (i.e., mol fractions) of In, Ga, and Zn. In an embodiment, the fractions x, y, and z, may be chosen to satisfy the constraint: $0<x\leq0.5$, $0<y\leq0.5$ and $0<z\leq0.5$. In various embodiments, the layers of the laminated structure include layers of other oxides, such as, but not limited to, InWO, InZnO, InSnO, GaO, and InO. The semiconductor layer 1802 may be doped via ion implantation to form source and drain active regions of the TFT structure.

Figure 19:
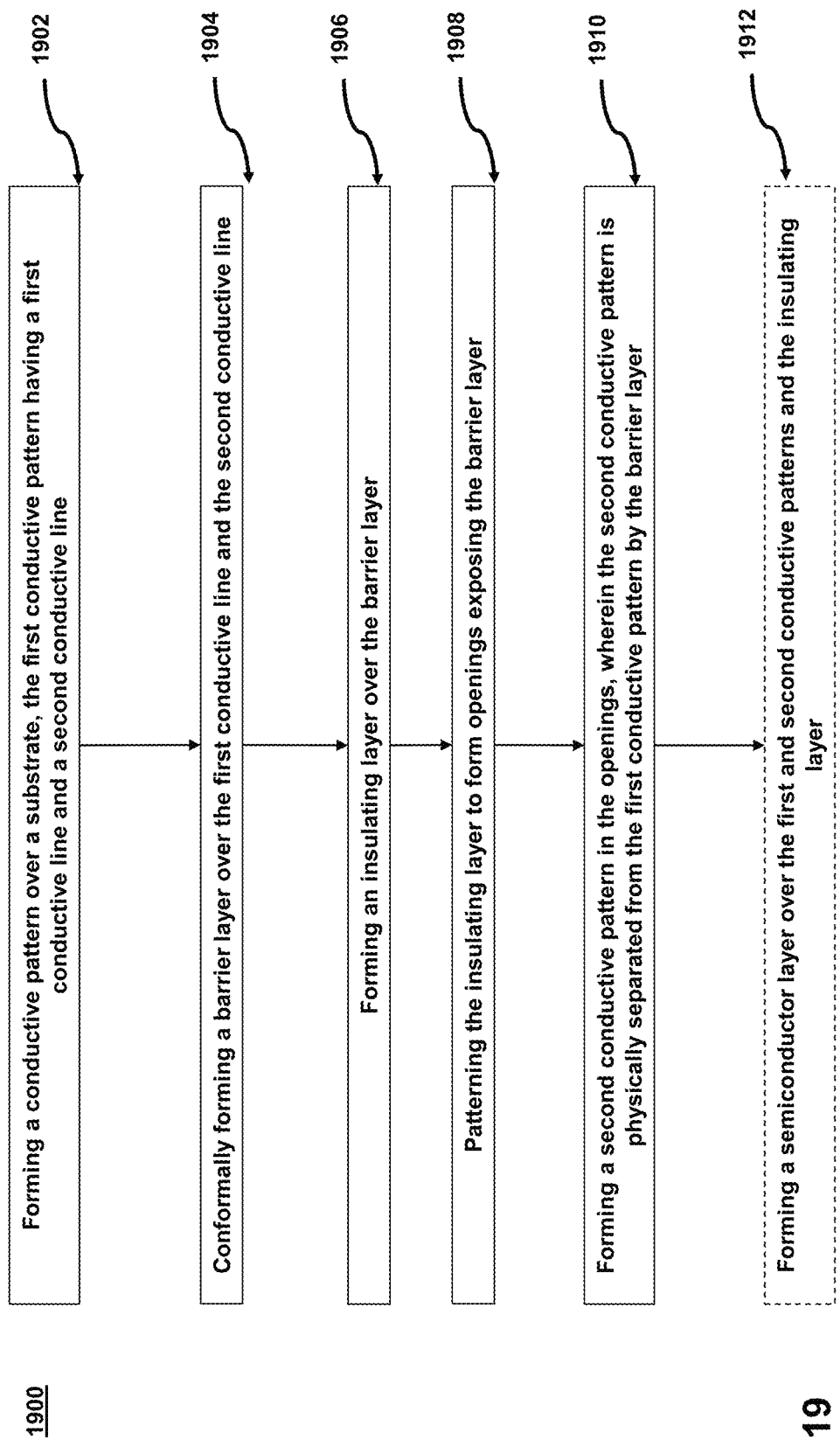
FIG. 19 is a flowchart illustrating stages of a method of fabricating a semiconductor structure, according to various embodiments.

FIG. 19 is a flowchart illustrating operations of a method 1900 of fabricating a semiconductor structure, according to various embodiments. A first operation 1902 of the method 1900 may include forming a first conductive pattern over a substrate. In operation 1904, the method 1900 may include conformally forming a barrier layer 202 (e.g., see FIG. 5) over the first conductive line 102a and the second conductive line 102b of the intermediate structure 400 of FIG. 4. The barrier layer 202 may also be formed over surfaces of the substrate 104 adjacent to the first conductive line 102a and the second conductive line 102b.

In operation 1906, the method 1900 may include forming an insulating layer, for example an oxide layer 106 (e.g., see FIG. 6), over the barrier layer (e.g., over the barrier layer 202 of FIG. 5). Forming the oxide layer 106 may include depositing the oxide layer 106 over portions of the barrier layer 202 of the intermediate structure of FIG. 5. In operation 1908, the method 1900 may include patterning the oxide layer 106 to form openings (e.g., see cavity 802 in FIGS. 8 and 16) exposing the barrier layer 202. A patterned photoresist 108 may be formed, for example, over the intermediate structure of FIG. 6. The photoresist 108 may be patterned using photolithography techniques to generate openings 110 in the photoresist 108. The patterned photoresist 108 may be used as a mask for patterning the oxide layer 106. An anisotropic etch process may be performed to remove regions the oxide layer 106 to thereby generate the openings (e.g., cavity 802 illustrated in FIGS. 8 and 16).

In operation 1910, the method 1900 may include forming a second conductive pattern in the openings, wherein the second conductive pattern includes a third conductive line that is physically separated from the first conductive pattern by the barrier layer 202. For example, the second conductive pattern may include third conductive line 204 (e.g., see FIGS. 9 to 17). Third conductive lines 204 may be formed by depositing a conductive material in the cavities 802 (e.g., see FIGS. 8 and 16).

In optional operation 1912, the method 1900 may include an optional operation of depositing a semiconductor material 1802 (e.g., see FIG. 18 and related description) such that the semiconductor structure 1800 forms a thin film transistor (TFT) structure with the first conductive line 102a and the second conductive line 102b forming gate electrodes, the third conductive line 204 forming a source or drain contact, and the semiconductor layer 1802 forming a channel material of the TFT structure. Further, the barrier layer 202 may act as a gate dielectric separating the first conductive line 102a and the second conductive line 102b from the semiconductor material 1802.

The method 1900 may further include doping the semiconductor layer to form a source active region or a drain active region. In embodiment methods that do not include optional operation 1912, the formed first conductive line 102a, second conductive line 102b and third conductive line 204 may function as simply conductive lines.

Disclosed embodiments may further include a semiconductor structure having: a first conductive pattern formed over a substrate, with the first conductive pattern including a first conductive line 102a and a second conductive line 102b. A barrier layer 202, 1202 (e.g., see FIGS. 1, 2, 5 to 12, and 14 to 18) may be formed over the first conductive line 102a and over the second conductive line 102b of the first conductive pattern. An insulating layer 106 may be formed over the barrier layer 202, 1202; and a second conductive pattern, including a third conductive line 204 that is separated from the first conductive pattern by the barrier layer 202, 1202, may be formed. Further, the third conductive line 204 may be located between the first conductive line 102a and the second conductive line 102b and may substantially fill a space between the first conductive line 102a and the second conductive line 102b. A separation between the first conductive line 102a and the second conductive line 102b may correspond to a minimum feature spacing dictated by a resolution limit of an optical projection system that was used to generate the first conductive pattern.

In a further embodiment, a semiconductor structure may include a first conductive pattern formed over a substrate 104, wherein the first conductive pattern includes a first conductive line 102a and a second conductive line 102b; a first barrier layer formed 202 over the first conductive line 102a and over the second conductive line 102b of the first conductive pattern, the first barrier layer 202 including a high-k dielectric material; a second barrier layer 1202 formed over the first barrier layer 202, the second barrier layer 1202 including a high selectivity barrier material; an insulating layer 106 formed over the second barrier layer 1202; and a second conductive pattern including a third conductive line 204 that is separated from the first conductive pattern by the first barrier layer 202 and the second barrier layer 1202. The semiconductor structure may further include one or more additional barrier layers (202, 1202) configured to tune the electrical characteristics of the first conductive line 102a, the second conductive line 102b, and the third conductive line 204. Further, a separation between the first conductive line 102a and the second conductive line 102b may correspond to a minimum feature spacing dictated by a resolution limit of an optical projection system that was used to generate the first conductive pattern.

In a further embodiment, a thin film transistor structure 1800 may include: a first conductive pattern formed over a substrate, wherein the first conductive pattern includes a first conductive line 102a and a second conductive line 102b; a barrier layer 202, 1202 formed over the first conductive line 102a and over the second conductive line 102a of the first conductive pattern; and an insulating layer 106 formed over the barrier layer 202, 1202. The thin film transistor structure 1800 may further include a second conductive pattern including a third conductive line 204 that is separated from the first conductive pattern by the barrier layer 202, 1202, with the third conductive line 204 formed in a space between the first conductive line 102a and the second conductive line 102b.

The thin film transistor structure 1800 may further include a semiconductor material 1802 that is in conductive contact with the third conductive line 204 and is in contact with the insulating layer 106 and is separated from the first conductive line 102a and second conductive line 102b by the barrier layer 202. The barrier layer 202 may act as a gate dielectric that separates the first conductive line 102a and the second conductive line 102b from the semiconductor material. The semiconductor material 1802 may include one or more of amorphous silicon, InGaZnO, InWO, InZnO, InSnO, GaO, InO, and alloys thereof. A separation between the first conductive line 102a and the second conductive line 102b, in the film transistor structure 1800, may correspond to a minimum feature spacing dictated by a resolution limit of an optical projection system that was used to generate the first conductive pattern.

The disclosed embodiments are advantageous in that a barrier material is provided that covers the first plurality of conductive lines and also covers spaces between the first plurality of conductive lines. The presence of the barrier material prevents potential problems with alignment of the second plurality of lines relative to the first plurality of lines. In this way, the second plurality of conductive lines is prevented form damaging conductive lines in the first plurality due to the presence of the barrier layer. The barrier layer also prevents potential short circuit connections between the first plurality of conductive lines and the second plurality of conductive lines. The presence of the barrier layer also allows the first and second pluralities of conductive lines to be more closely spaced relative to one another than would otherwise be possible without the presence of the barrier layer.

The foregoing outlines features of several embodiments so that those skilled in the art may better understand the aspects of this disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of this disclosure, and that they may make various changes, substitutions, and alterations herein without departing from the spirit and scope of the present disclosure.

What is claimed is:

1. A method of fabricating a semiconductor structure, comprising:
  forming a first conductive pattern over a substrate, wherein the first conductive pattern comprises a first conductive line and a second conductive line;
  conformally forming a barrier layer over the first conductive line and the second conductive line of the first conductive pattern, comprising:
    depositing a silicon-containing dielectric material over the first conductive line and the second conductive line via one of CVD, ALD, and PVD,
    wherein the silicon-containing dielectric material includes one or more of silicon nitride, silicon oxynitride, silicon carbide, and silicon carbide nitride;
  forming an insulating layer over the barrier layer;
  patterning the insulating layer to form openings exposing the barrier layer; and
  forming a second conductive pattern in the openings, wherein the second conductive pattern comprises a third conductive line that is separated from the first conductive pattern by the barrier layer.

2. The method of claim 1, wherein forming the first conductive pattern comprises:
  forming a metal layer on the substrate;
  forming a patterned photoresist over the metal layer; and
  etching the metal layer to remove portions of the metal layer that are not masked by the patterned photoresist.

3. The method of claim 2, wherein forming the metal layer on the substrate further comprises:
  depositing, via a conformal process, one or more of copper, aluminum, zirconium, titanium, tantalum, ruthenium, palladium, platinum, cobalt, nickel, and alloys thereof,
  wherein the conformal process includes one of chemical vapor deposition (CVD), atomic layer deposition (ALD), and physical vapor deposition (PVD).

4. The method of claim 1, further comprising:
  depositing the silicon-containing dielectric material over the first conductive line and the second conductive line such that the barrier layer has a thickness in a range from 2 nm to 20 nm, from 3 nm to 12 nm, or from 5 nm to 10 nm.

5. The method of claim 1, wherein forming the insulating layer over the barrier layer further comprises:
  depositing one or more of silicon dioxide, silicon nitride, silicon carbide, undoped silicate glass, doped silicate glass, organosilicates glass, amorphous fluorinated carbon, porous variants thereof, and combinations thereof,
  wherein the deposition process comprises one of CVD, plasma enhanced CVD, ALD, PVD, a high density plasma CVD, metalorganic CVD, low pressure CVD, sputtering, spin coating, and laser ablation.

6. The method of claim 1, wherein patterning the insulating layer to form openings further comprises:
  forming a patterned photoresist over the insulating layer; and
  etching the insulating layer to remove portions of the insulating layer that are unmasked by the patterned photoresist.

7. The method of claim 1, wherein forming the second conductive pattern in the openings further comprises:
  depositing a metallic liner material via a conformal process, the metallic liner material including one or more of TiN, TaN, WN, TiC, TaC, and WC; and
  depositing a metallic fill material via a conformal process, the metallic fill material including one or more of W, Cu, Al, Co, Ru, Mo, Ta, Ti, alloys thereof, and combinations thereof,
  wherein the conformal process includes one of CVD, PVD, and ALD.

8. The method of claim 1, further comprising forming a semiconductor layer in contact with the third conductive line and the barrier layer over the first conductive line and the second conductive line.

9. A method of fabricating a semiconductor structure, comprising:
  forming a first conductive pattern over a substrate, wherein the first conductive pattern comprises a first conductive line and a second conductive line;
  conformally forming a first barrier layer over the first conductive line and the second conductive line of the first conductive pattern;
  conformally forming a second barrier layer over the first barrier layer;
  forming an insulating layer over the second barrier layer;
  patterning the insulating layer to form openings exposing the second barrier layer; and
  forming a second conductive pattern in the openings, wherein the second conductive pattern comprises a third conductive line that is separated from the first conductive pattern by the second barrier layer.

10. The method of claim 9, wherein conformally forming the first barrier layer over the first conductive line and the second conductive line comprises depositing a silicon-containing dielectric material over the first conductive line and the second conductive line via one of CVD, ALD, and PVD.

11. The method of claim 10, wherein the silicon-containing dielectric material further comprises a lower dielectric constant (low-k) material than the second barrier layer, such that the low-k material reduces electrical interference and parasitic capacitance of the first conductive line and the second conductive line.

12. The method of claim 9, wherein conformally forming the second barrier layer over the first barrier layer comprises depositing a high selectivity barrier material.

13. The method of claim 9, wherein forming the insulating layer over the barrier layer further comprises:
  depositing one or more of silicon dioxide, silicon nitride, silicon carbide, undoped silicate glass, doped silicate glass, organosilicates glass, amorphous fluorinated carbon, porous variants thereof, and combinations thereof,
  wherein the deposition process comprises one of CVD, plasma enhanced CVD, ALD, PVD, a high density plasma CVD, metalorganic CVD, low pressure CVD, sputtering, spin coating, and laser ablation.

14. A method of fabricating a semiconductor structure, comprising:
  forming a first conductive pattern over a substrate, wherein the first conductive pattern comprises a first conductive line and a second conductive line;
  conformally forming a barrier layer over the first conductive line and the second conductive line of the first conductive pattern;

forming an insulating layer over the barrier layer;
patterning the insulating layer to form openings exposing the barrier layer;
forming a second conductive pattern in the openings, wherein the second conductive pattern comprises a third conductive line that is separated from the first conductive pattern by the barrier layer; and
forming a semiconductor layer in contact with the third conductive line and the barrier layer over the first conductive line and the second conductive line.

15. The method of claim 14, wherein forming the first conductive pattern over a substrate further comprises forming a gate electrode in a thin-film transistor (TFT).

16. The method of claim 14, wherein forming the second conductive pattern over a substrate further comprises forming a contact in a thin-film transistor (TFT).

17. The method of claim 14, wherein forming the barrier layer comprises forming a gate dielectric separating the first conductive line and the second conductive line from the semiconductor material.

18. The method of claim 14, wherein forming the semiconductor layer comprises depositing a semiconductor material, such that the semiconductor structure forms a channel layer for a thin film transistor (TFT) structure with the first conductive line and the second conductive line forming the gate electrode and the third conductive line forming the contact of a source or drain in a thin-film transistor (TFT).

19. The method of claim 18, wherein depositing a semiconductor material comprises depositing at least one of amorphous silicon, InWO, InZnO, InSnO, GaO, InO, or InGaZnO.

20. The method of claim 18, wherein depositing a semiconductor material further comprises laminated layers of InWO, InZnO, InSnO, GaO, and InO.

* * * * *